(12) United States Patent
Lee et al.

(10) Patent No.: US 11,032,952 B2
(45) Date of Patent: Jun. 8, 2021

(54) ELECTRONIC DEVICE INCLUDING SHIELD CAN

(71) Applicant: SAMSUNG ELECTRONICS CO., LTD., Suwon-si (KR)

(72) Inventors: Chang Joon Lee, Gwangmyeong-si (KR); Yong Won Lee, Seongnam-si (KR); Hyun Tae Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/919,257

(22) Filed: Mar. 13, 2018

(65) Prior Publication Data

US 2018/0270997 A1    Sep. 20, 2018

(30) Foreign Application Priority Data

Mar. 17, 2017   (KR) ........................ 10-2017-0033922

(51) Int. Cl.
*H05K 9/00* (2006.01)
*H05K 1/02* (2006.01)
(Continued)

(52) U.S. Cl.
CPC ......... *H05K 9/0024* (2013.01); *H05K 1/0216* (2013.01); *H05K 9/0028* (2013.01);
(Continued)

(58) Field of Classification Search
CPC .......... H05K 9/0024; H05K 1/00; H05K 1/02; H05K 1/14; H05K 1/141–144;
(Continued)

(56) References Cited

U.S. PATENT DOCUMENTS 4,739,453 A * 4/1988 Kurokawa ........... H05K 9/0039
                                                            361/816
5,377,081 A * 12/1994 Bizen .................... H01L 25/165
                                                            174/382
(Continued)

FOREIGN PATENT DOCUMENTS

CN     1280348 A     1/2001
CN     1774804 A     5/2016
(Continued)

OTHER PUBLICATIONS

Search Report dated Jun. 8, 2018 in counterpart International Patent Application No. PCT/KR2018/002374.
(Continued)

*Primary Examiner* — Tuan T Dinh
(74) *Attorney, Agent, or Firm* — Nixon & Vanderhye P.C.

(57) ABSTRACT

An electronic device includes a printed circuit board (PCB) including a first surface, a second surface facing a direction opposite the first surface, and a side surface surrounding a space between the first surface and the second surface, at least one component disposed on the first surface, a shield can surrounding the at least one component and a partial area of the PCB, and an adhesive that bonds the shield can and the first surface, and that bonds the shield can and the second surface, and at least a portion of the shield can does not bond with the side surface.

20 Claims, 24 Drawing Sheets

(51) Int. Cl.
*H05K 1/18* (2006.01)
*H05K 1/11* (2006.01)

(52) U.S. Cl.
CPC ......... *H05K 9/0033* (2013.01); *H05K 1/0243* (2013.01); *H05K 1/111* (2013.01); *H05K 1/181* (2013.01); *H05K 2201/1056* (2013.01); *H05K 2201/10159* (2013.01); *H05K 2201/10371* (2013.01); *H05K 2201/10545* (2013.01)

(58) Field of Classification Search
CPC .... H05K 1/18; H05K 1/181–187; H05K 9/00; H05K 9/0039
USPC .......... 361/752, 816, 818; 174/350; 257/685
See application file for complete search history.

(56) References Cited

U.S. PATENT DOCUMENTS

| | | | |
|---|---|---|---|
| 5,436,803 A | 7/1995 | Annis et al. | |
| 6,037,846 A * | 3/2000 | Oberhammer | H01R 13/7195 |
| | | | 174/367 |
| 6,313,400 B1 * | 11/2001 | Mosquera | H05K 5/026 |
| | | | 174/363 |
| 6,683,245 B1 * | 1/2004 | Ogawa | H05K 9/0037 |
| | | | 174/382 |
| 7,109,410 B2 | 9/2006 | Arnold et al. | |
| D548,738 S | 8/2007 | Doyle et al. | |
| D549,231 S | 8/2007 | Doyle et al. | |
| D549,706 S | 8/2007 | Doyle et al. | |
| 7,262,369 B1 | 8/2007 | English | |
| 7,443,693 B2 * | 10/2008 | Arnold | H01L 23/04 |
| | | | 361/800 |
| 8,039,764 B2 * | 10/2011 | Yang | H05K 7/142 |
| | | | 174/138 G |
| 2004/0027819 A1 * | 2/2004 | Berberich | H05K 9/0028 |
| | | | 361/818 |
| 2007/0139904 A1 * | 6/2007 | English | H05K 9/0032 |
| | | | 361/818 |
| 2007/0209833 A1 | 9/2007 | English | |
| 2007/0274059 A1 | 11/2007 | (Chennupati)Raghuram | |
| 2008/0080160 A1 * | 4/2008 | English | H05K 9/0032 |
| | | | 361/818 |
| 2009/0207579 A1 | 8/2009 | Boetto et al. | |
| 2010/0246143 A1 | 9/2010 | Dinh et al. | |
| 2011/0299262 A1 | 12/2011 | Crotty | |
| 2011/0310546 A1 | 12/2011 | Doglio et al. | |
| 2013/0120957 A1 | 5/2013 | Werner et al. | |

FOREIGN PATENT DOCUMENTS

| | | |
|---|---|---|
| JP | 2000-196278 | 7/2000 |
| JP | 2008-177417 | 7/2008 |

OTHER PUBLICATIONS

Written Opinion dated Jun. 8, 2018 in counterpart International Patent Application No. PCT/KR2018/002374.
Chinese Office Action dated May 19, 2020 for Chinese Application No. 201880018295.1.
Chinese Office Action dated Mar. 22, 2021 for CN Application No. 201880018295.1.

* cited by examiner

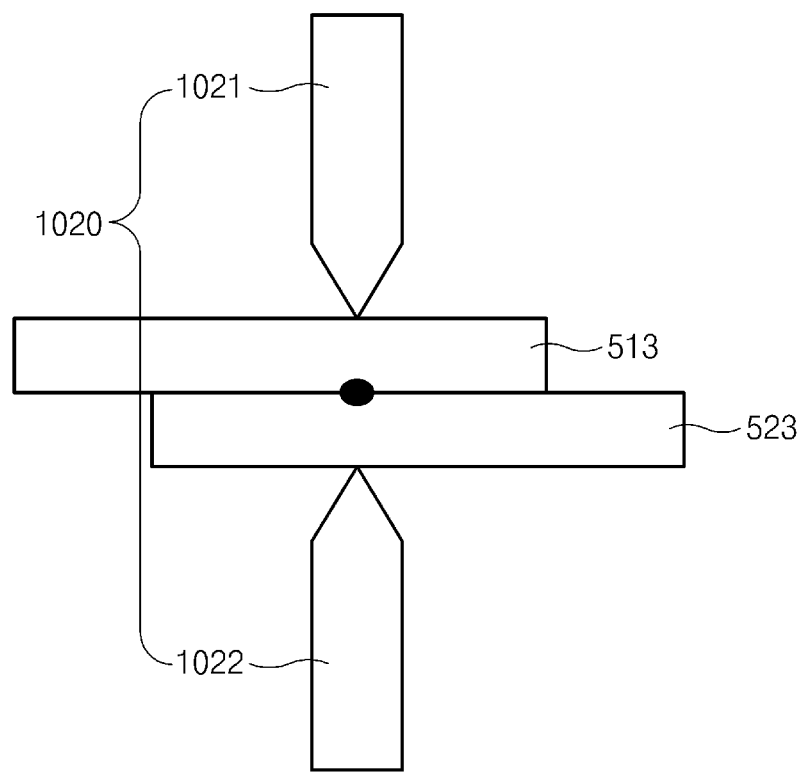
F I G. 10B

ELECTRONIC DEVICE INCLUDING SHIELD CAN

CROSS-REFERENCE TO RELATED APPLICATION

This application is based on and claims priority under 35 U.S.C. § 119 to Korean Patent Application No. 10-2017-0033922, filed on Mar. 17, 2017, in the Korean Intellectual Property Office, the disclosure of which is incorporated by reference herein in its entirety.

BACKGROUND

1. Field

The present disclosure relates to a technology for enhancing electromagnetic interference shielding effectiveness.

2. Description of Related Art

Electronic devices, such as smartphones, wearable devices, and the like, have been widely used with the development of mobile communication technologies. These electronic devices may include various components, such as an application processor (AP), a communication processor (CP), a memory, and the like, to provide a variety of functions to users.

However, the aforementioned components may generate electromagnetic waves, and the electromagnetic waves may cause malfunctions in the electronic devices. Furthermore, the electromagnetic waves may have harmful influences on human bodies. Accordingly, technologies relating to shield cans for shielding electromagnetic waves have recently been developed.

The above information is presented as background information only to assist with an understanding of the present disclosure. No determination has been made, and no assertion is made, as to whether any of the above might be applicable as prior art with regard to the present disclosure.

FIG. 1 is a sectional view of a printed board assembly (PBA) in the related art.

Referring to FIG. 1, a printed board assembly (PBA) 10 in the related art may include a shield can 12 that covers a component 11 to shield electromagnetic waves generated from the component 11. A pad 14 may be attached to a front surface 13f and a side surface 13s of a printed circuit board (PCB) 13 to fix the shield can 12. The shield can 12 may be soldered on the pad 14 after the pad 14 is attached to the PCB 13.

However, according to the PBA 10 in the related art, a space corresponding to the thickness of the pad 14 may be formed between the shield can 12 and the PCB 13 since the shield can 12 is soldered on the pad 14. Electromagnetic waves generated from the component 11 may be emitted through the space, and therefore electromagnetic interference shielding effectiveness of the PBA 10 may be decreased.

Furthermore, according to the PBA 10 in the related art, the width w2 of the PBA 10 may be increased since the pad 14 is attached to the PCB 13. For example, the pad 14 having a predetermined width of w1 may be required to solder the shield can 12 on the pad 14. Due to this, the width w2 of the PBA 10 may also be increased when the pad 14 is attached to the PCB 13.

Moreover, according to the PBA 10 in the related art, contact surfaces of the pad 14 and the PCB 13 have to be plated to attach the pad 14 to the PCB 13. A complex manufacturing process may be required to plate the contact surfaces of the pad 14 and the PCB 13, and therefore manufacturing cost and time for the PBA 10 may be increased.

SUMMARY

Embodiments of the present disclosure address at least the above-mentioned problems and/or disadvantages and provide at least the advantages described below. Accordingly, an aspect of the present disclosure is to provide an electronic device for addressing the above-mentioned problems and disadvantages.

In accordance with an aspect of the present disclosure, an electronic device includes a printed circuit board (PCB) including a first surface, a second surface facing away from the first surface, and a side surface surrounding a space between the first surface and the second surface, at least one component disposed on the first surface, a shield can surrounding the at least one component and a partial area of the PCB, and an adhesive that bonds the shield can to the first surface, and that bonds the shield can to the second surface, wherein at least a portion of the shield can does not bond with the side surface.

In accordance with another aspect of the present disclosure, an electronic device includes a printed circuit board (PCB) including a first surface, a second surface facing away from the first surface, and a side surface surrounding a space between the first surface and the second surface, a component disposed on the first surface, a first shield can including a planar member parallel to the first surface and a side member surrounding the component, and a second shield can disposed on the opposite side to the first shield can with respect to the PCB, wherein an area of the side member that is connected with the second shield can is spaced apart from the side surface.

In accordance with another aspect of the present disclosure, an electronic device includes a PCB including a first surface, a second surface facing away from the first surface, and a side surface surrounding a space between the first surface and the second surface, a component disposed on the first surface, a first shield can having at least a portion disposed on the first surface and covering the component, and a second shield can having at least a portion disposed on the second surface. The first surface and the first shield can, and the second surface and the second shield can are connected through an adhesive, wherein the first shield can and the second shield can are physically connected.

According to embodiments disclosed herein, electromagnetic interference shielding effectiveness of an electronic device may be enhanced. Furthermore, the width of the electronic device may be reduced.

In addition, the present disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 10B is a diagram illustrating an example process of welding shield cans according to another embodiment;

Throughout the drawings, it should be noted that like reference numbers are used to depict the same or similar elements, features, and structures.

DETAILED DESCRIPTION

Figure 1:
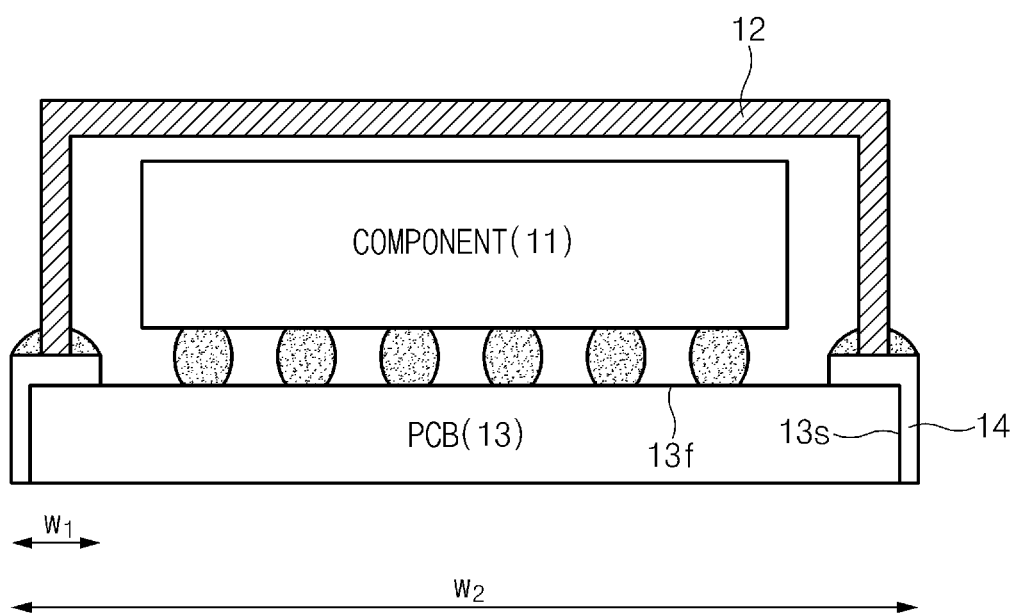
FIG. 1 is a cross-sectional view of a printed board assembly (PBA) in the related art.

Hereinafter, various example embodiments of the present disclosure may be described with reference to accompanying drawings. Accordingly, those of ordinary skill in the art will recognize that modifications, equivalent, and/or alternatives of the various embodiments described herein can be variously made without departing from the scope and spirit of the present disclosure. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. On the other hand, when an element (e.g., a first element) is referred to as being "directly coupled with/to" or "directly connected to" another element (e.g., a second element), it should be understood that there is no intervening element (e.g., a third element).

According to the situation, the expression "configured to" used in this disclosure may be used interchangeably with, for example, the expression "suitable for", "having the capacity to", "designed to", "adapted to", "made to", or "capable of". The term "configured to" must not refer only to "specifically designed to" in hardware. Instead, the expression "a device configured to" may refer to a situation in which the device is "capable of" operating together with another device or other components. For example, a "processor configured to (or set to) perform A, B, and C" may refer, for example, and without limitation, to a dedicated processor (e.g., an embedded processor) for performing a corresponding operation or a generic-purpose processor (e.g., a central processing unit (CPU) or an application processor) which performs corresponding operations by executing one or more software programs which are stored in a memory device, or the like.

Terms used in this disclosure are used to describe specified embodiments and are not intended to limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices, or the like, but are not limited thereto. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit), or the like, but are not limited thereto.

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, or the like, but are not limited thereto.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like), or the like, but are not limited thereto.

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like), or the like, but are not limited thereto. According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may include other electronic devices and new electronic devices according to the development of technologies.

Hereinafter, electronic devices according to various embodiments will be described with reference to the accompanying drawings. In this disclosure, the term "user" may refer to a person who uses an electronic device or may refer to a device (e.g., an artificial intelligence electronic device) that uses the electronic device.

Figure 2:
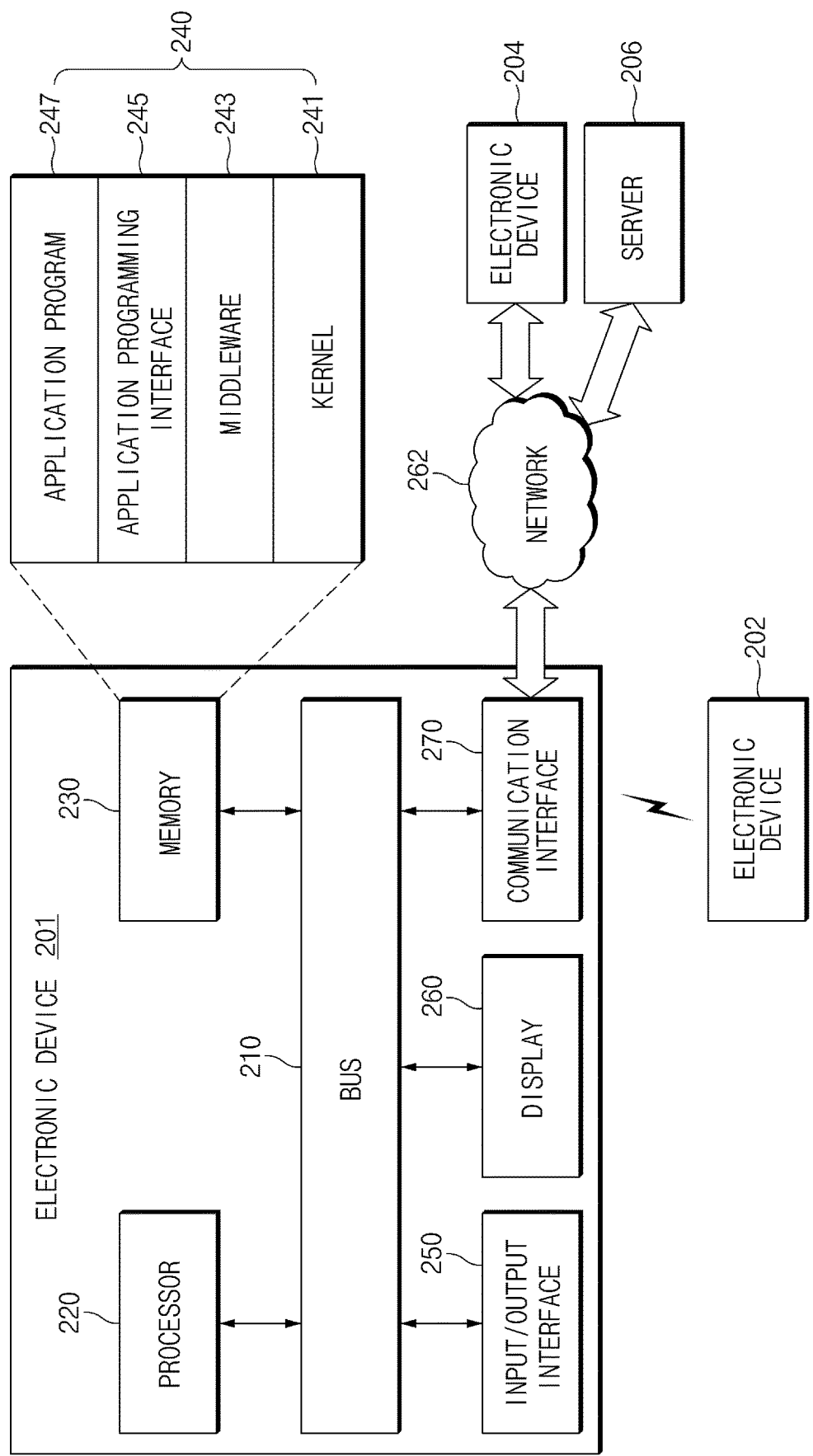
FIG. 2 is a diagram illustrating an example electronic device in a network environment according to various embodiments.

FIG. 2 is a diagram illustrating an electronic device in a network environment system, according to various embodiments.

Referring to FIG. 2, according to various embodiments, an electronic device 201, a first electronic device 202, a second electronic device 204, and/or a server 206 may be connected each other over a network 262 or a short range communication connection 264. The electronic device 201 may include a bus 210, a processor (e.g., including processing circuitry) 220, a memory 230, an input/output interface (e.g., including input/output circuitry) 250, a display 260, and a communication interface (e.g., including communication circuitry) 270. According to an embodiment, the electronic device 201 may not include at least one of the above-described elements or may further include other element(s).

For example, the bus 210 may interconnect the above-described elements 210 to 270 and may include a circuit for conveying communications (e.g., a control message and/or data) among the above-described elements.

The processor 220 may include various processing circuitry, such as, for example, and without limitation, one or more of a dedicated processor, a central processing unit (CPU), an application processor (AP), or a communication processor (CP), or the like. For example, the processor 220 may perform an arithmetic operation or data processing associated with control and/or communication of at least other elements of the electronic device 201.

The memory 230 may include a volatile and/or nonvolatile memory. For example, the memory 230 may store commands or data associated with at least one other element(s) of the electronic device 201. According to an embodiment, the memory 230 may store software and/or a program 240. The program 240 may include, for example, a kernel 241, a middleware 243, an application programming interface (API) 245, and/or an application program (or "an application") 247. At least a part of the kernel 241, the middleware 243, or the API 245 may be referred to as an "operating system (OS)".

For example, the kernel 241 may control or manage system resources (e.g., the bus 210, the processor 220, the memory 230, and the like) that are used to execute operations or functions of other programs (e.g., the middleware 243, the API 245, and the application program 247). Furthermore, the kernel 241 may provide an interface that allows the middleware 243, the API 245, or the application program 247 to access discrete elements of the electronic device 201 so as to control or manage system resources.

The middleware 243 may perform, for example, a mediation role such that the API 245 or the application program 247 communicates with the kernel 241 to exchange data.

Furthermore, the middleware 243 may process task requests received from the application program 247 according to a priority. For example, the middleware 243 may assign the priority, which makes it possible to use a system resource (e.g., the bus 210, the processor 220, the memory 230, or the like) of the electronic device 201, to at least one of the application program 247. For example, the middleware 243 may process the one or more task requests according to the priority assigned to the at least one, which makes it possible to perform scheduling or load balancing on the one or more task requests.

The API 245 may be, for example, an interface through which the application program 247 controls a function provided by the kernel 241 or the middleware 243, and may include, for example, at least one interface or function (e.g., a command) for a file control, a window control, image processing, a character control, or the like.

The input/output interface 250 may include various input/output circuitry and play a role, for example, of an interface which transmits a command or data input from a user or another external device, to other element(s) of the electronic device 201. Furthermore, the input/output interface 250 may output a command or data, received from other element(s) of the electronic device 201, to a user or another external device.

The display 260 may include, for example, a liquid crystal display (LCD), an organic LED (OLED) display, a microelectromechanical systems (MEMS) display, or an electronic paper display, or the like, but is not limited thereto. The display 260 may display, for example, various contents (e.g., a text, an image, a video, an icon, a symbol, and the like) to a user. The display 260 may include a touch screen and may receive, for example, a touch, gesture, proximity, or hovering input using an electronic pen or a part of a user's body.

For example, the communication interface 270 may establish communication between the electronic device 201 and an external device (e.g., the first electronic device 202, the second electronic device 204, or the server 206). For example, the communication interface 270 may be connected to the network 262 over wireless communication or wired communication to communicate with the external device (e.g., the second electronic device 204 or the server 206).

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the short range communication 264. The short range communication 264 may include at least one of wireless fidelity (Wi-Fi), light fidelity (Li-Fi), Bluetooth, near field communication (NFC), magnetic stripe transmission (MST), a global navigation satellite system (GNSS), or the like.

The MST may generate a pulse in response to transmission data using an electromagnetic signal, and the pulse may generate a magnetic field signal. The electronic device 201 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 262 may include at least one of telecommunications networks, for example, a computer network (e.g., LAN or WAN), an Internet, or a telephone network.

Each of the first and second electronic devices 202 and 204 may be a device of which the type is different from or the same as that of the electronic device 201. According to an embodiment, the server 206 may include a group of one or more servers. According to various embodiments, all or a portion of operations that the electronic device 201 will perform may be executed by another or plural electronic devices (e.g., the first electronic device 202, the second electronic device 204 or the server 206). According to an embodiment, in the case where the electronic device 201 executes any function or service automatically or in response to a request, the electronic device 201 may not perform the function or the service internally, but, alternatively additionally, it may request at least a portion of a function associated with the electronic device 201 from another device (e.g., the electronic device 202 or 204 or the server 206). The other electronic device may execute the requested function or additional function and may transmit the execution result to the electronic device 201. The electronic device 201 may provide the requested function or service using the received result or may additionally process the received result to provide the requested function or service. To this end, for example, cloud computing, distributed computing, or client-server computing may be used.

Figure 3:
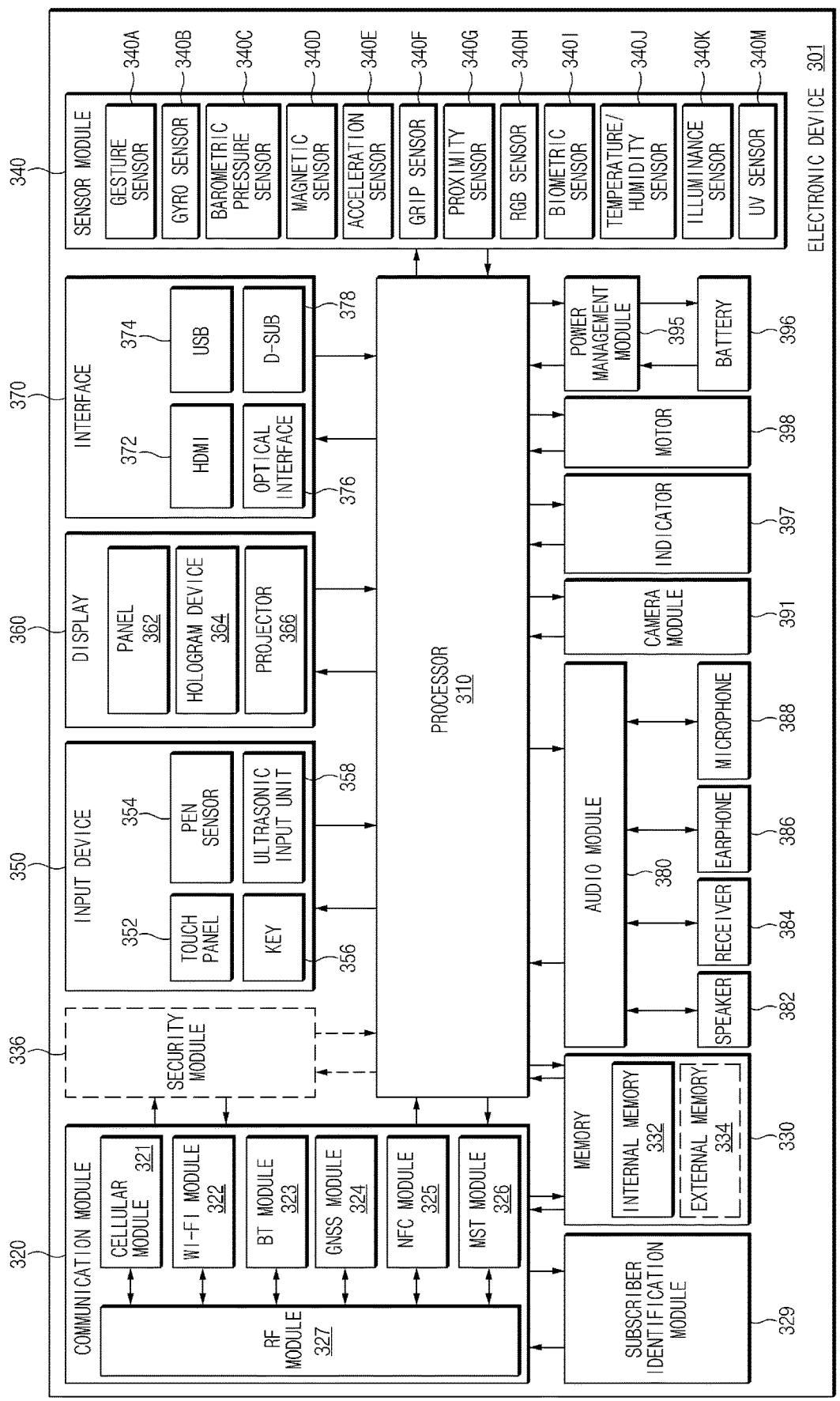
FIG. 3 is a block diagram illustrating an example electronic device according to various embodiments.

FIG. 3 is a block diagram illustrating an example electronic device, according to various embodiments.

Referring to FIG. 3, an electronic device 301 may include, for example, all or a part of the electronic device 201 illustrated in FIG. 2. The electronic device 301 may include one or more processors (e.g., an application processor (AP)) (e.g., including processing circuitry) 310, a communication module (e.g., including communication circuitry) 320, a subscriber identification module 329, a memory 330, a security module 336, a sensor module 340, an input device (e.g., including input circuitry) 350, a display 360, an interface (e.g., including interface circuitry) 370, an audio module 380, a camera module 391, a power management module 395, a battery 396, an indicator 397, and a motor 398.

The processor 310 may include various processing circuitry and drive, for example, an operating system (OS) or an application to control a plurality of hardware or software elements connected to the processor 310 and may process and compute a variety of data. For example, the processor 310 may be implemented with a System on Chip (SoC). According to an embodiment, the processor 310 may further include a graphic processing unit (GPU) and/or an image signal processor. The processor 310 may include at least a part (e.g., a cellular module 321) of elements illustrated in FIG. 3. The processor 310 may load a command or data, which is received from at least one of other elements (e.g., a nonvolatile memory), into a volatile memory and process the loaded command or data. The processor 310 may store a variety of data in the nonvolatile memory.

The communication module 320 may be configured the same as or similar to the communication interface 270 of FIG. 2. The communication module 320 may include modules, each of which may include various communication circuitry, such as, for example, and without limitation, the cellular module 321, a Wi-Fi module 322, a Bluetooth (BT) module 323, a GNSS module 324 (e.g., a GPS module, a Glonass module, a Beidou module, or a Galileo module), a near field communication (NFC) module 325, a MST module 326 and a radio frequency (RF) module 327, or the like.

The cellular module 321 may provide, for example, voice communication, video communication, a character service, an Internet service, or the like over a communication network. According to an embodiment, the cellular module 321 may perform discrimination and authentication of the electronic device 301 within a communication network by using the subscriber identification module (e.g., a SIM card) 329. According to an embodiment, the cellular module 321 may perform at least a portion of functions that the processor 310 provides. According to an embodiment, the cellular module 321 may include a communication processor (CP).

Each of the Wi-Fi module 322, the BT module 323, the GNSS module 324, the NFC module 325, or the MST module 326 may include a processor for processing data exchanged through a corresponding module, for example. According to an embodiment, at least a part (e.g., two or more) of the cellular module 321, the Wi-Fi module 322, the BT module 323, the GNSS module 324, the NFC module 325, or the MST module 326 may be included within one Integrated Circuit (IC) or an IC package.

For example, the RF module 327 may transmit and receive a communication signal (e.g., an RF signal). For example, the RF module 327 may include a transceiver, a power amplifier module (PAM), a frequency filter, a low noise amplifier (LNA), an antenna, or the like. According to another embodiment, at least one of the cellular module 321, the Wi-Fi module 322, the BT module 323, the GNSS module 324, the NFC module 325, or the MST module 326 may transmit and receive an RF signal through a separate RF module.

The subscriber identification module 329 may include, for example, a card and/or embedded SIM that includes a subscriber identification module and may include unique identity information (e.g., integrated circuit card identifier (ICCID)) or subscriber information (e.g., integrated mobile subscriber identity (IMSI)).

The memory 330 (e.g., the memory 230) may include an internal memory 332 and/or an external memory 334. For example, the internal memory 332 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 334 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 334 may be operatively and/or physically connected to the electronic device 301 through various interfaces.

A security module 336 may be a module that includes a storage space of which a security level is higher than that of the memory 330 and may be a circuit that guarantees safe data storage and a protected execution environment. The security module 336 may be implemented with a separate circuit and may include a separate processor. For example, the security module 336 may be in a smart chip or a secure digital (SD) card, which is removable, or may include an embedded secure element (eSE) embedded in a fixed chip of the electronic device 301. Furthermore, the security module 336 may operate based on an operating system (OS) that is different from the OS of the electronic device 301. For example, the security module 336 may operate based on java card open platform (JCOP) OS.

The sensor module 340 may measure, for example, a physical quantity or may detect an operation state of the electronic device 301. The sensor module 340 may convert the measured or detected information to an electrical signal. For example, the sensor module 340 may include at least one of a gesture sensor 340A, a gyro sensor 340B, a barometric pressure sensor 340C, a magnetic sensor 340D, an acceleration sensor 340E, a grip sensor 340F, the proximity sensor 340G, a color sensor 340H (e.g., red, green, blue (RGB) sensor), a biometric sensor 340I, a temperature/humidity sensor 340J, an illuminance sensor 340K, and/or an UV sensor 340M. Although not illustrated, additionally or generally, the sensor module 340 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 340 may further include a control circuit for controlling at least one or more sensors included therein. According to an embodiment, the electronic device 301 may further include a processor that is a part of the processor 310 or independent of the processor 310 and is configured to control the sensor module 340. The processor may control the sensor module 340 while the processor 310 remains at a sleep state.

The input device 350 may include various input circuitry, such as, for example, and without limitation, a touch panel 352, a (digital) pen sensor 354, a key 356, and/or an ultrasonic input unit 358, or the like. For example, the touch panel 352 may use at least one of capacitive, resistive, infrared and ultrasonic detecting methods. Also, the touch panel 352 may further include a control circuit. The touch panel 352 may further include a tactile layer to provide a tactile reaction to a user.

The (digital) pen sensor 354 may be, for example, a part of a touch panel or may include an additional sheet for recognition. The key 356 may include, for example, a physical button, an optical key, a keypad, or the like. The ultrasonic input device 358 may detect (or sense) an ultrasonic signal, which is generated from an input device, through a microphone (e.g., a microphone 388) and may check data corresponding to the detected ultrasonic signal.

The display 360 (e.g., the display 260) may include a panel 362, a hologram device 364, or a projector 366. The panel 362 may be the same as or similar to the display 260 illustrated in FIG. 2. The panel 362 may be implemented, for example, to be flexible, transparent or wearable. The panel 362 and the touch panel 352 may be integrated into a single module. The hologram device 364 may display a stereoscopic image in a space using a light interference phenomenon. The projector 366 may project light onto a screen so as to display an image. For example, the screen may be arranged in the inside or the outside of the electronic device 301. According to an embodiment, the display 360 may further include a control circuit for controlling the panel 362, the hologram device 364, or the projector 366.

The interface 370 may include various interface circuitry, such as, for example, and without limitation, a high-definition multimedia interface (HDMI) 372, a universal serial bus (USB) 374, an optical interface 376, and/or a D-subminiature (D-sub) 378, or the like. The interface 370 may be included, for example, in the communication interface 270 illustrated in FIG. 2. Additionally or generally, the interface 370 may include, for example, a mobile high definition link (MHL) interface, a SD card/multi-media card (MMC) interface, or an infrared data association (IrDA) standard interface.

The audio module 380 may convert a sound and an electric signal in dual directions. At least a part of the audio module 380 may be included, for example, in the input/output interface 250 illustrated in FIG. 2. The audio module 380 may process, for example, sound information that is input or output through a speaker 382, a receiver 384, an earphone 386, or the microphone 388.

For example, the camera module 391 may shoot a still image or a video. According to an embodiment, the camera module 391 may include at least one or more image sensors (e.g., a front sensor or a rear sensor), a lens, an image signal processor (ISP), or a flash (e.g., an LED or a xenon lamp).

The power management module 395 may manage, for example, power of the electronic device 301. According to an embodiment, a power management integrated circuit (PMIC), a charger IC, or a battery or fuel gauge may be included in the power management module 395. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 396 and a voltage, current or temperature thereof while the battery is charged. The battery 396 may include, for example, a rechargeable battery and/or a solar battery.

The indicator 397 may display a specific state of the electronic device 301 or a part thereof (e.g., the processor 310), such as a booting state, a message state, a charging state, and the like. The motor 398 may convert an electrical signal into a mechanical vibration and may generate the following effects: vibration, haptic, and the like. Although not illustrated, a processing device (e.g., a GPU) for supporting a mobile TV may be included in the electronic device 301. The processing device for supporting the mobile TV may process media data according to the standards of digital multimedia broadcasting (DMB), digital video broadcasting (DVB), MediaFlo™, or the like.

Each of the above-mentioned elements of the electronic device according to various embodiments of the present disclosure may be configured with one or more components, and the names of the elements may be changed according to the type of the electronic device. In various embodiments, the electronic device may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination.

Figure 4:
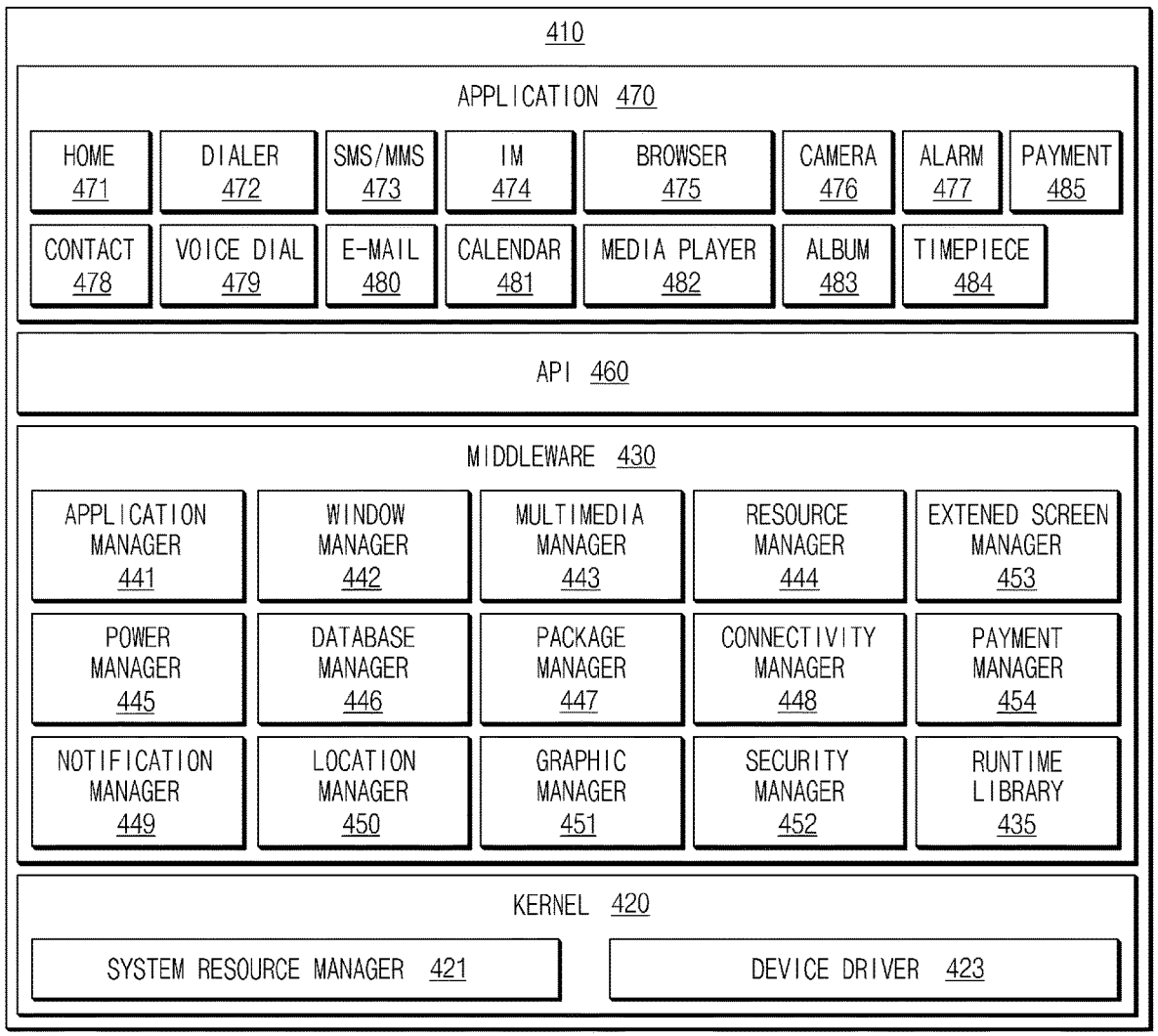
FIG. 4 is a block diagram illustrating an example program module according to various embodiments.

FIG. 4 is a block diagram illustrating an example program module, according to various embodiments.

According to an embodiment, a program module 410 (e.g., the program 240) may include an operating system (OS) to control resources associated with an electronic device (e.g., the electronic device 201), and/or diverse applications (e.g., the application program 247) driven on the OS. The OS may be, for example, Android™ iOS™, Windows™, Symbian™, or Tizen™.

The program module 410 may include a kernel 420, a middleware 430, an application programming interface (API) 460, and/or an application 470. At least a portion of the program module 410 may be preloaded on an electronic device or may be downloadable from an external electronic device (e.g., the first electronic device 202, the second electronic device 204, the server 206, or the like).

The kernel 420 (e.g., the kernel 241) may include, for example, a system resource manager 421 and/or a device driver 423. The system resource manager 421 may perform control, allocation, or retrieval of system resources. According to an embodiment, the system resource manager 421 may include a process managing unit, a memory managing unit, or a file system managing unit. The device driver 423 may include, for example, a display driver, a camera driver, a Bluetooth driver, a shared memory driver, a USB driver, a keypad driver, a Wi-Fi driver, an audio driver, or an inter-process communication (IPC) driver.

The middleware 430 may provide, for example, a function that the application 470 needs in common, or may provide diverse functions to the application 470 through the API 460 to allow the application 470 to efficiently use limited system resources of the electronic device. According to an embodiment, the middleware 430 (e.g., the middleware 243) may include at least one of a runtime library 435, an application manager 441, a window manager 442, a multimedia manager 443, a resource manager 444, a power manager 445, a database manager 446, a package manager 447, a connectivity manager 448, a notification manager 449, a location manager 450, a graphic manager 451, a security manager 452, an extended screen manager 453, and/or a payment manager 454, or the like.

The runtime library 435 may include, for example, a library module that is used by a compiler to add a new function through a programming language while the application 470 is being executed. The runtime library 435 may perform input/output management, memory management, or capacities about arithmetic functions.

The application manager 441 may manage, for example, a life cycle of at least one application of the application 470. The window manager 442 may manage a graphic user interface (GUI) resource that is used in a screen. The multimedia manager 443 may identify a format necessary for playing diverse media files, and may perform encoding or decoding of media files by using a codec suitable for the format. The resource manager 444 may manage resources such as a storage space, memory, or source code of at least one application of the application 470.

The power manager 445 may operate, for example, with a basic input/output system (BIOS) to manage capacity of a battery, temperature, or power, and may determine and provide power information for an operation of an electronic device by using corresponding information from among the capacity of a battery, temperature, or power. The database manager 446 may generate, search for, or modify database that is to be used in at least one application of the application 470. The package manager 447 may install or update an application that is distributed in the form of package file.

The connectivity manager 448 may manage, for example, wireless connection such as Wi-Fi or Bluetooth. The notification manager 449 may display or notify an event such as arrival message, appointment, or proximity notification in a mode that does not disturb a user. The location manager 450 may manage location information about an electronic device. The graphic manager 451 may manage a graphic effect that is provided to a user, or manage a user interface relevant thereto. The security manager 452 may provide a general security function necessary for system security, user authentication, or the like. For example, the extended screen manager 453 may determine the area of a display in which a graphic image is displayed. According to an embodiment, the extended screen manager 453 may manage information to be provided, a graphic effect, or a user interface associated with the information to be provided or the graphic effect, through the area of a display determined such that a graphic image is displayed.

According to an embodiment, in the case where an electronic device (e.g., the electronic device 201) includes a telephony function, the middleware 430 may further include a telephony manager for managing a voice or video call function of the electronic device. The middleware 430 may include a middleware module that combines diverse functions of the above-described elements. The middleware 430 may provide a module specialized to each OS kind to provide differentiated functions. Additionally, the middleware 430 may dynamically remove a part of the preexisting elements or may add new elements thereto.

The API 460 (e.g., the API 245) may be, for example, a set of programming functions and may be provided with a configuration that is variable depending on an OS. For example, in the case where an OS is Android™ or iOS™, it may provide one API set per platform. In the case where an OS is Tizen™, it may provide two or more API sets per platform.

The application 470 (e.g., the application program 247) may include, for example, one or more applications capable of providing functions for a home 471, a dialer 472, an SMS/MMS 473, an instant message (IM) 474, a browser 475, a camera 476, an alarm 477, a contact 478, a voice dial 479, an e-mail 480, a calendar 481, a media player 482, an album 483, a timepiece 484, and/or a payment 485 for offering health care (e.g., measuring an exercise quantity, blood sugar, or the like) or environment information (e.g., information of barometric pressure, humidity, temperature, or the like).

According to an embodiment, the application 470 may include an application (hereinafter referred to as "information exchanging application" for descriptive convenience) to support information exchange between an electronic device (e.g., the electronic device 201) and an external electronic device (e.g., the first electronic device 202 or the second electronic device 204). The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the information exchanging application may receive, for example, notification information from an external electronic device and provide the notification information to a user.

The device management application may manage (e.g., install, delete, or update), for example, at least one function (e.g., turn-on/turn-off of an external electronic device itself (or a part of elements) or adjustment of brightness (or resolution) of a display) of the external electronic device which communicates with the electronic device, an application running in the external electronic device, or a service (e.g., a call service, a message service, or the like) provided from the external electronic device.

According to an embodiment, the application 470 may include an application (e.g., a health care application of a mobile medical device) that is assigned in accordance with an attribute of an external electronic device. According to an embodiment, the application 470 may include an application that is received from an external electronic device (e.g., the first electronic device 202, the second electronic device 204, or the server 206). According to an embodiment, the application 470 may include a preloaded application or a third party application that is downloadable from a server. The names of elements of the program module 410 according to the embodiment may be modifiable depending on kinds of operating systems.

According to various embodiments, at least a portion of the program module 410 may be implemented by software, firmware, hardware, or a combination of two or more thereof. At least a portion of the program module 410 may be implemented (e.g., executed), for example, by the processor (e.g., the processor 310). At least a portion of the program module 410 may include, for example, modules, programs, routines, sets of instructions, processes, or the like for performing one or more functions.

The term "module" used in this disclosure may refer, for example, to a unit including one or more combinations of hardware, software and/or firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, and without limitation, the "module" may include at least one of a dedicated processor, a CPU, an application-specific IC (ASIC) chip, a field-programmable gate array (FPGA), and a programmable-logic device for performing some operations, or the like, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor (e.g., the processor 220), may cause the one or more processors to perform a function corresponding to the instruction. The computer-readable storage media, for example, may be the memory 230.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, the one or more instructions may contain a code made by a compiler or a code executable by an interpreter. The above hardware unit may be configured to operate via one or more software modules for performing an operation according to various embodiments, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

Figure 5A:
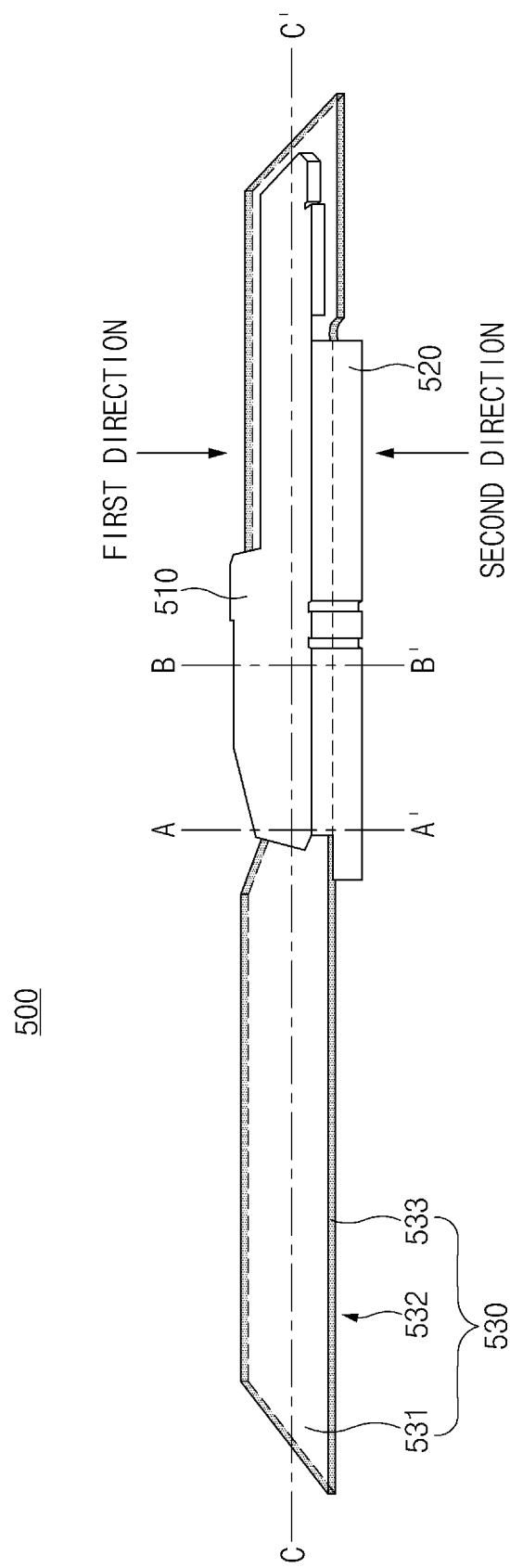
FIG. 5A is a diagram illustrating a PBA according to an embodiment.
Figure 5B:
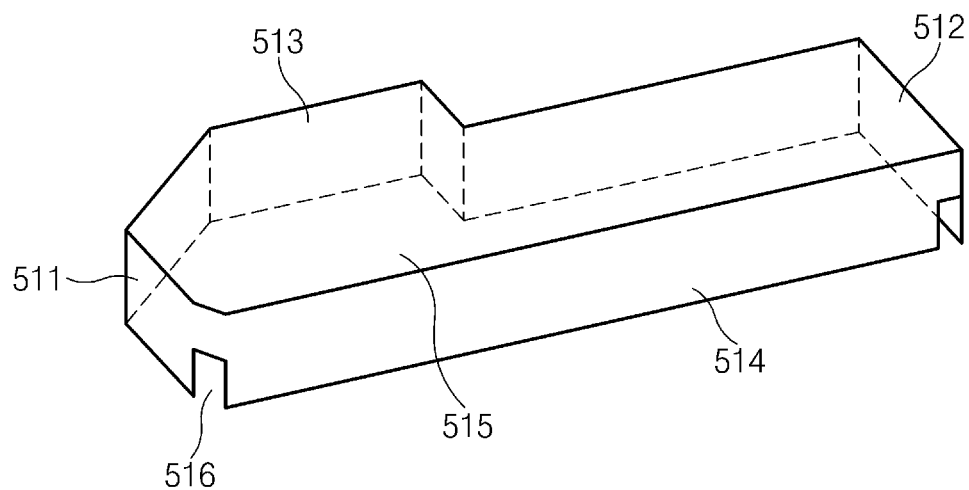
FIG. 5B is a diagram illustrating a first shield can according to an embodiment.
Figure 5C:
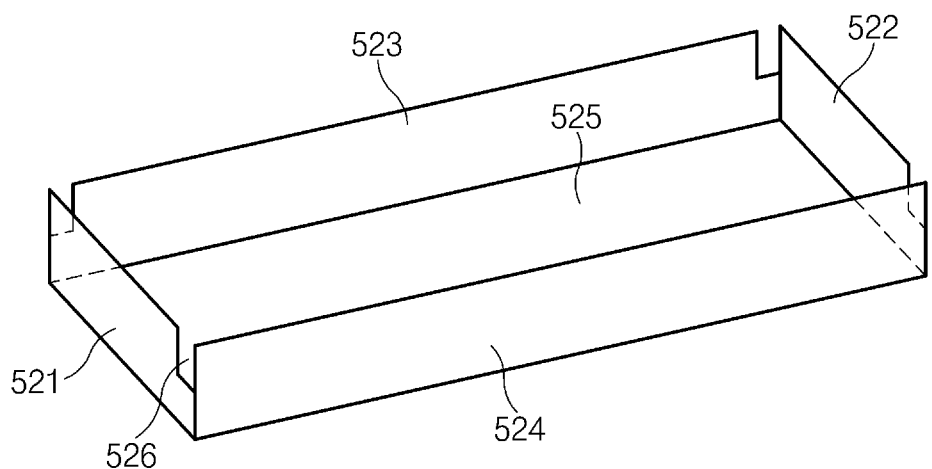
FIG. 5C is a diagram illustrating a second shield can according to an embodiment.

FIG. 5A is a diagram illustrating a PBA according to an embodiment. FIG. 5B is a diagram illustrating a first shield can according to an embodiment. FIG. 5C is a diagram illustrating a second shield can according to an embodiment.

Referring to FIG. 5A, an electronic device (e.g., the electronic device 201 of FIG. 2) may include a printed board assembly (PBA) 500 for mounting components (e.g., the processor 220, the memory 230, and the like of FIG. 2). In this disclosure, the PBA 500 may refer to a configuration in which the components are mounted on a printed circuit board (PCB) 530.

According to an embodiment, the PBA 500 may include a first shield can 510, a second shield can 520, and the PCB 530. The PCB 530 may include a first surface 531, a second surface 532, and a side surface 533. At least one of the components and at least a portion of the first shield can 510 may be disposed on the first surface 531. For example, the first shield can 510 may be disposed on the first surface 531, and the processor 220 may be disposed between the first surface 531 and the first shield can 510.

At least one of the components and at least a portion of the second shield can 520 may be disposed on the second surface 532. For example, the second shield can 520 may be disposed on the second surface 532, and the memory 230 may be disposed between the second surface 532 and the second shield can 520. In this disclosure, the first surface 531 and the second surface 532 may be referred to as a front surface and a rear surface of the PCB 530, respectively. Furthermore, the PCB 530 may include the side surface 533 that is substantially perpendicular to the first surface 531 and the second surface 532.

Referring to FIGS. 5A and 5B, to cover components disposed on the first surface 531, the first shield can 510 may include a first side member 511, a second side member 512, a third side member 513, and a fourth side member 514 that surround the components, and a planar member 515 parallel to the first surface 531. The planar member 515 may be connected with the side members 511 to 514. A space (e.g., reference number 516) may be formed between the side members 511 to 514.

The first shield can 510 may be a single element included in the electronic device. However, for the convenience of description, it is assumed that the first shield can 510 includes the first side member 511, the second side member 512, the third side member 513, the fourth side member 514, and the planar member 515, as described above.

Referring to FIGS. 5A and 5C, to cover components disposed on the second surface 532, the second shield can 520 may include a first side member 521, a second side member 522, a third side member 523, and a fourth side member 524 that surround the components, and a planar member 525 parallel to the second surface 532. The planar member 525 may be connected with the side members 521 to 524. A space (e.g., reference number 526) may be formed between the side members 521 to 524.

The second shield can 520 may also be a single element included in the electronic device. However, for the convenience of description, it is assumed that the second shield can 520 includes the first side member 521, the second side member 522, the third side member 523, the fourth side member 524, and the planar member 525, as described above.

Referring again to FIG. 5A, the first shield can 510 and the second shield can 520 may surround a partial area of the PCB 530 to shield electromagnetic waves generated from the components. To this end, the first shield can 510 and the second shield can 520 may be fixed to the first surface 531 and the second surface 532, respectively. For example, the first side member 511 and the second side member 512 of the first shield can 510 may be soldered on the first surface 531 or fixed to the first surface 531 through a conductive tape or a conductive adhesive. The first side member 521 and the second side member 522 of the second shield can 520 may also be soldered on the second surface 532 or fixed to the second surface 532 through a conductive tape or a conductive adhesive.

In the state in which the first shield can 510 and the second shield can 520 are fixed, the third side member 513 and the fourth side member 514 of the first shield can 510 may be connected with the third side member 523 and the fourth side member 524 of the second shield can 520, respectively. For example, the third side member 513 of the first shield can 510 and the third side member 523 of the second shield can 520 may be welded together, and the fourth side member 514 of the first shield can 510 and the fourth side member 524 of the second shield can 520 may be welded together. The first shield can 510 and the second shield can 520 welded together may surround the components disposed on the PCB 530. Accordingly, the first shield can 510 and the second shield can 520 may shield electromagnetic waves generated from the components.

In this disclosure, the contents described with reference to FIGS. 5A and 5B may be applied to elements having the same reference number as the PBA 500 illustrated in FIGS. 5A and 5B.

Figure 6A:
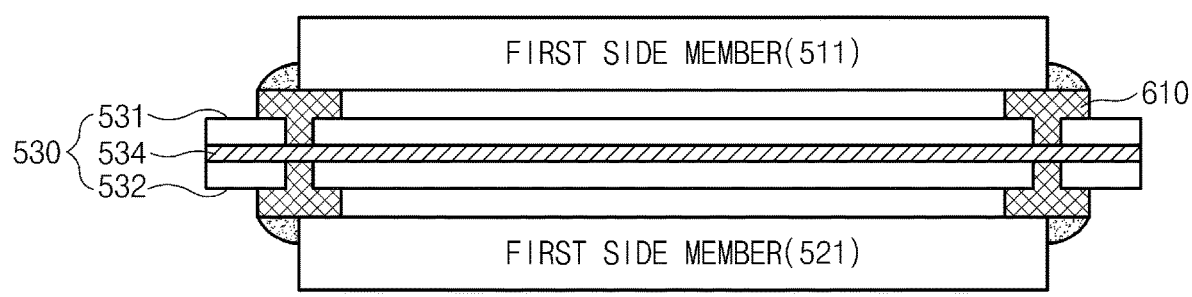
FIG. 6A is a sectional view of a PBA according to an embodiment.
Figure 6B:
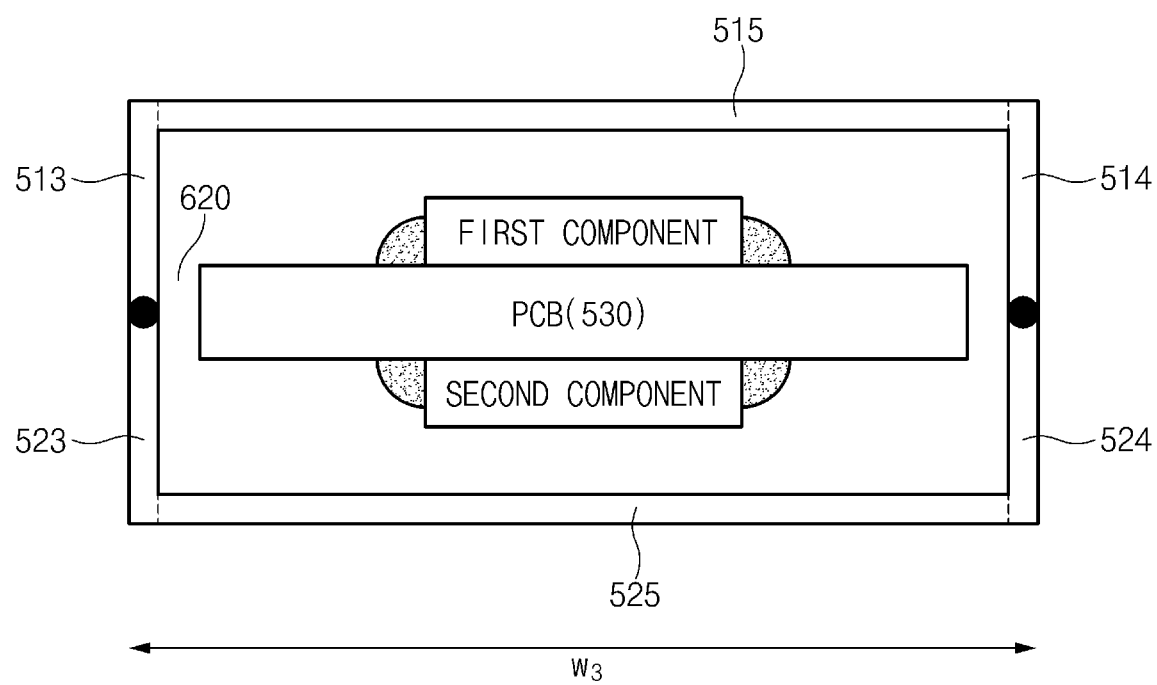
FIG. 6B is a sectional view of a PBA according to another embodiment.
Figure 6C:
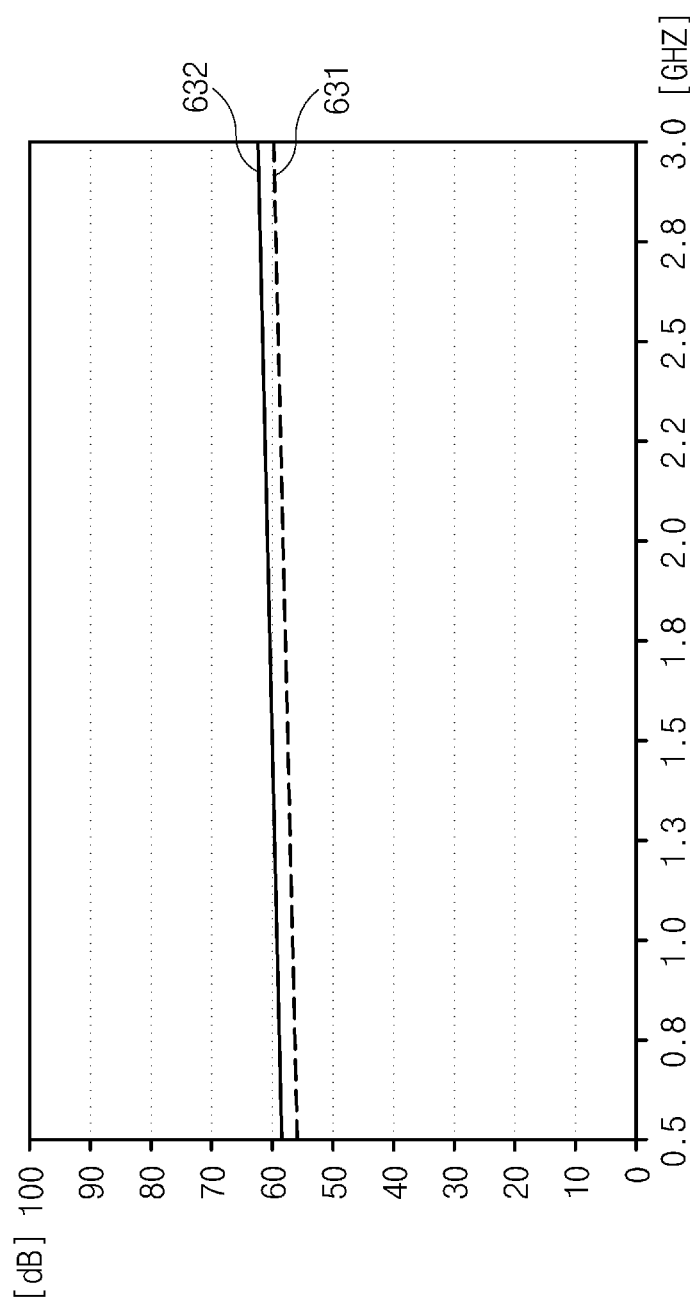
FIG. 6C is a diagram illustrating graphs depicting electromagnetic interference shielding effectiveness of PBAs according to an embodiment.

FIG. 6A is a sectional view of a PBA according to an embodiment. FIG. 6A is a sectional view of the PBA 500 that is taken along line A-A' of FIG. 5A. FIG. 6B is a sectional view of a PBA according to another embodiment. FIG. 6B is a sectional view of the PBA 500 that is taken along line B-B' of FIG. 5A. FIG. 6C is a diagram illustrating graphs depicting electromagnetic interference shielding effectiveness of PBAs according to an embodiment. The graphs illustrated in FIG. 6C depict electromagnetic interference shielding effectiveness of the PBA 10 illustrated in FIG. 1 and electromagnetic interference shielding effectiveness of the PBA 500 illustrated in FIG. 5A.

Referring to FIG. 6A, the PBA 500 may include a pad 610. The pad 610 may be a connecting member for fixing the first side member 511 to the first surface 531. For example, the first side member 511 may not be directly soldered on the first surface 531, but may be soldered on the pad 610. Since a portion of the pad 610 extends to the interior of the PCB 530, the first side member 511 may be more firmly fixed to the PCB 530 when being soldered on the pad 610 than when being directly soldered on the PCB 530. Although not illustrated in FIG. 6A, the second side member 512 may also be fixed to the PCB 530 or the pad 610. Furthermore, the first side member 521 (and the second side member 522) of the second shield can 520 may also be fixed to the PCB 530 or the pad 610 through the above-described process.

In the state in which the first side member 511 (and/or the second side member 512) is fixed to the PCB 530 or the pad 610, the third side member 513 and the fourth side member 514 may be connected to the second shield can 520. For example, the third side member 513 and the fourth side member 514 of the first shield can 510 may be connected to the third side member 523 and the fourth side member 524 of the second shield can 520, respectively. For example, referring to FIG. 6B, the third side member 513 and the fourth side member 514 may be welded to the second shield can 520. Furthermore, the third side member 513 and the fourth side member 514 may be connected with the second shield can 520 through a conductive tape or a conductive adhesive, or may be soldered on the second shield can 520.

Since the third side member 513 and the fourth side member 514 are connected to the second shield can 520, a space 620 may be formed between the third side member 513 (and the fourth side member 514) and the PCB 530. That is, the first shield can 510 and the second shield can 520 may surround a partial area of the PCB 530 without a member (e.g., a pad, solder, or the like) for bonding the third side member 513 (and the fourth side member 514) and the PCB 530. According to an embodiment of the present disclosure, the width w3 of the PBA 500 may be reduced since a member for bonding the third side member 513 (and the fourth side member 514) and the PCB 530 is not required. With the reduction in the width w3 of the PBA 500, the width of the electronic device 201 may also be reduced, and therefore a user's sense of grip may be enhanced.

Furthermore, according to an embodiment of the present disclosure, the amount of electromagnetic waves emitted to the outside from the PBA 500 may be reduced by directly connecting the third side member 513 (and the fourth side member 514) and the second shield can 520. Accordingly, electromagnetic interference shielding effectiveness of the PBA 500 may be enhanced. In this regard, referring to FIG. 6C, it can be seen that electromagnetic interference shielding effectiveness on a graph 632 is 2 dB to 3 dB higher than that on a graph 631. The graph 631 depicts electromagnetic interference shielding effectiveness of the PBA 10 illustrated in FIG. 1, and the graph 632 depicts electromagnetic interference shielding effectiveness of the PBA 500 illustrated in FIG. 5A.

According to an embodiment, electromagnetic interference shielding effectiveness may be enhanced by soldering the first shield can 510 on the pad 610. Referring again to FIG. 6A, a portion of the pad 610 may be connected with a ground layer 534 located between the first surface 531 and the second surface 532. Accordingly, the first shield can 510 and the second shield can 520 may be electrically connected with the ground layer 534. That is, electronic components disposed in an inner space between the first shield can 510 and the second shield can 520 may have substantially the same effect as being disposed inside a conductor having ground potential, and thus the electromagnetic interference shielding effectiveness of the PBA 500 may be enhanced.

According to an embodiment, the first shield can 510 and the second shield can 520 may comprise, for example, and without limitation, materials listed in Table 1 below to effectively shield electromagnetic waves.

TABLE 1

| Material | Major Component | Additive Elements |
| --- | --- | --- |
| nickel silver | copper (Cu), nickel (Ni), zinc (Zn) | lead (Pb), manganese (Mn), tin (Sn) |
| stainless steel | iron (Fe), chromium (Cr), nickel (Ni) | carbon (C), manganese (Mn), silicon (Si), molybdenum (Mo) |
| steel | iron (Fe) | carbon (C), manganese (Mn), silicon (Si) |
| aluminum (Al) | aluminum (Al) | manganese (Mn), iron (Fe), silicon (Si), chromium (Cr) |
| copper (Cu) | copper (Cu) | nickel (Ni), cobalt (Co), iron (Fe), tin (Sn), zinc (Zn) |
| titanium (Ti) | titanium (Ti) | vanadium (V), molybdenum (Mo) |

In the case where the first shield can 510 comprises nickel silver, the first shield can 510 may be less likely to corrode, and in the case where the first shield can 510 comprises stainless steel, the first shield can 510 may have high strength. In the case where the first shield can 510 comprises steel, the first shield can 510 may be manufactured at a low cost and may have high strength, and in the case where the first shield can 510 comprises aluminum, the first shield can 510 may have high thermal conductivity and light weight. In the case where the first shield can 510 comprises copper, the first shield can 510 may have high thermal conductivity, and in the case where the first shield can 510 comprises titanium, the first shield can 510 may have high strength. The descriptions of the first shield can 510 may also be applied to the second shield can 520.

Figure 7A:
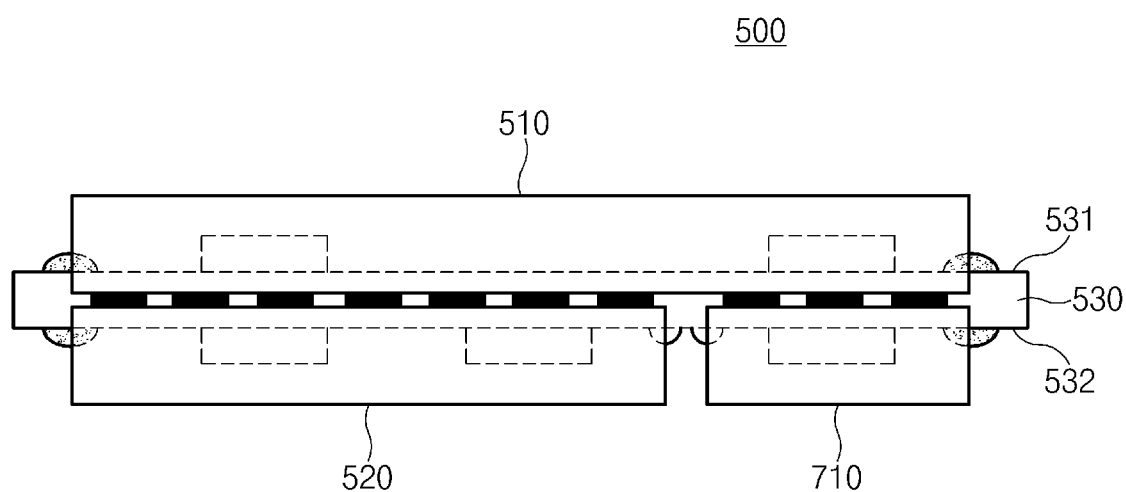
FIG. 7A is a sectional view of a PBA according to another embodiment.
Figure 7B:
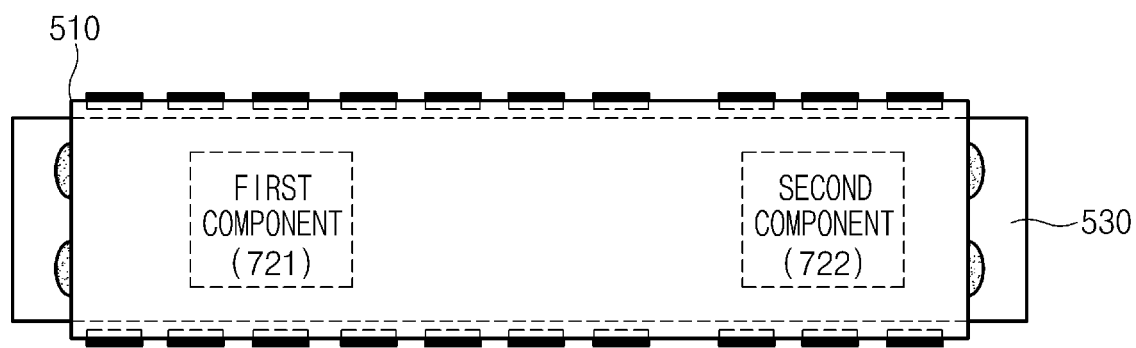
FIG. 7B is a plan view of a PBA according to an embodiment.
Figure 7C:
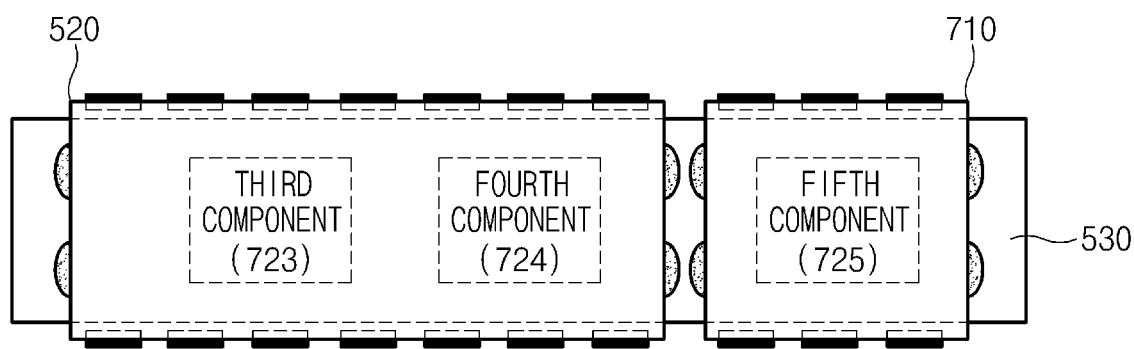
FIG. 7C is a plan view of a PBA according to another embodiment.

FIG. 7A is a sectional view of a PBA according to another embodiment. FIG. 7A is a sectional view of the PBA 500 that is taken along line C-C' of FIG. 5A. FIG. 7B is a plan view of a PBA according to an embodiment. FIG. 7B is a plan view of the PBA 500 illustrated in FIG. 5A, when viewed in a first direction. FIG. 7C is a plan view of a PBA according to another embodiment. FIG. 7C is a plan view of the PBA 500 illustrated in FIG. 5A, when viewed in a second direction.

Referring to FIG. 7A, the PBA 500 may include a plurality of shield cans 510, 520, and 710. For example, as illustrated in FIG. 7A, the first shield can 510 may be disposed on the first surface 531, and the second shield can 520 and the third shield can 710 may be disposed on the second surface 532. In this case, the first shield can 510, the second shield can 520, and the third shield can 710 may be welded to one another. The second shield can 520 and the third shield can 710 may not be welded together and may be spaced apart from each other.

Unlike in FIG. 7A, a plurality of shield cans may be disposed on the first surface 531. In this case, the plurality of shield cans disposed on the first surface 531 may be welded to the plurality of shield cans disposed on the second surface 532. For example, the first shield can 510 and the second shield can 520 may be welded together, and the third shield can 710 and a fourth shield can (e.g., a shield can additionally disposed on the first surface 531) may be welded together.

Referring to FIGS. 7B and 7C, one or more components may be disposed between the shield cans and the PCB 530. In the case where one or more components are disposed, the sizes of the shield cans may increase in proportion to the number of components. For example, two components 721 and 722 may be disposed between the first shield can 510 and the PCB 530, and one component 725 may be disposed between the third shield can 710 and the PCB 530. Accordingly, the first shield can 510 may be larger in size than the third shield can 710.

Unlike in the above-described embodiment, the sizes of the shield cans may vary depending on the intervals between components. For example, the interval between the components 721 and 722 that are disposed between the first shield can 510 and the PCB 530 may be greater than the interval between components 723 and 724 disposed between the second shield can 520 and the PCB 530. Accordingly, the first shield can 510 may be larger in size than the second shield can 520.

Figure 8A:
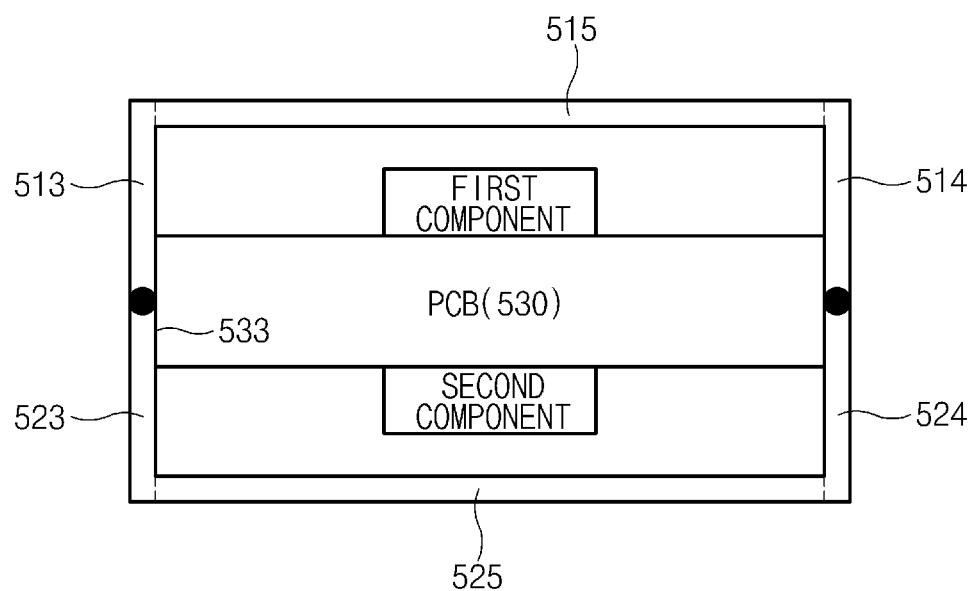
FIG. 8A is a diagram illustrating a first shield can and a second shield can combined together, according to an embodiment.
Figure 8B:
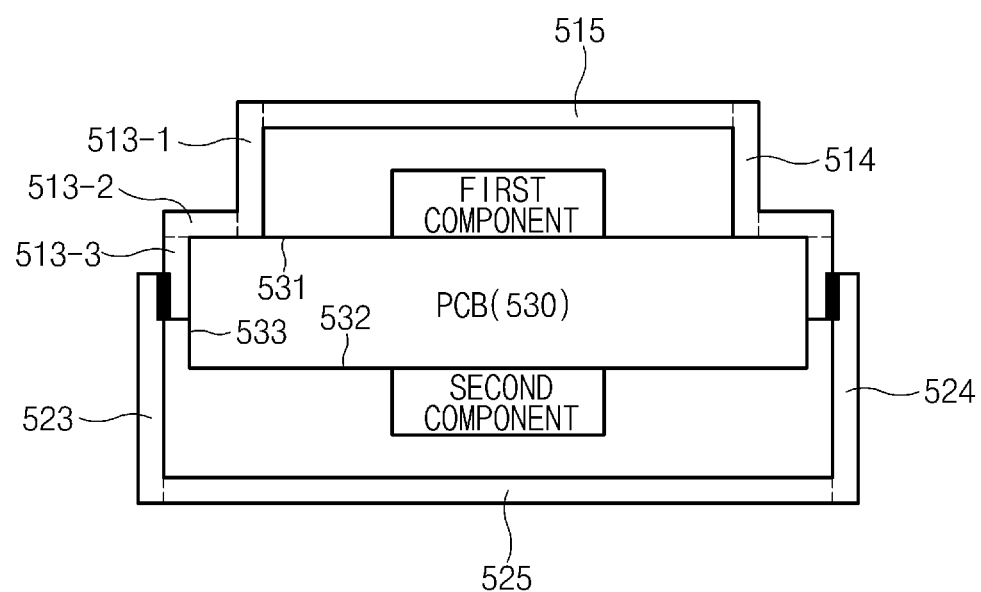
FIG. 8B is a diagram illustrating a first shield can and a second shield can combined together, according to another embodiment.
Figure 8C:
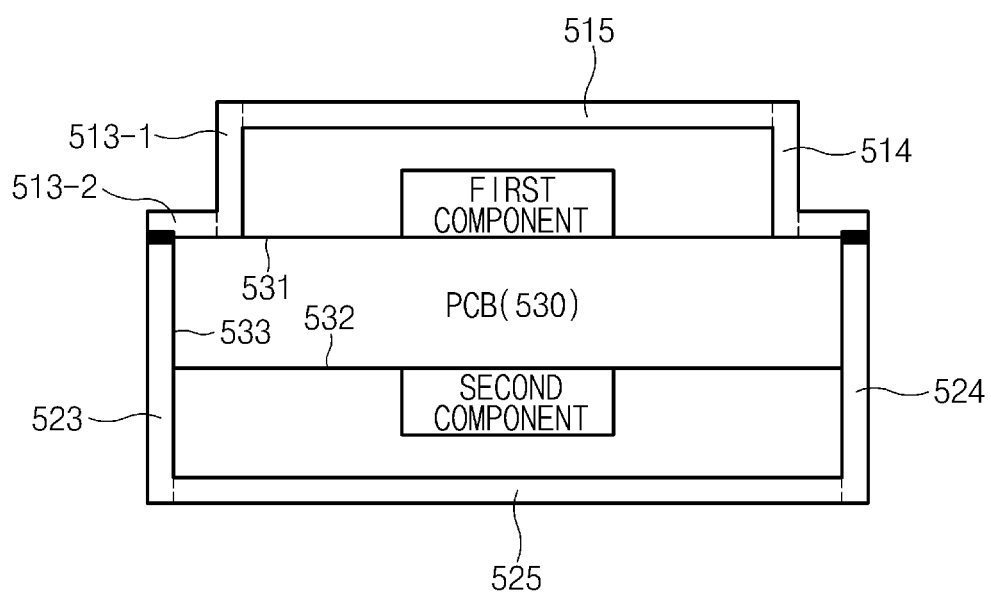
FIG. 8C is a diagram illustrating a first shield can and a second shield can combined together, according to another embodiment.
Figure 8D:
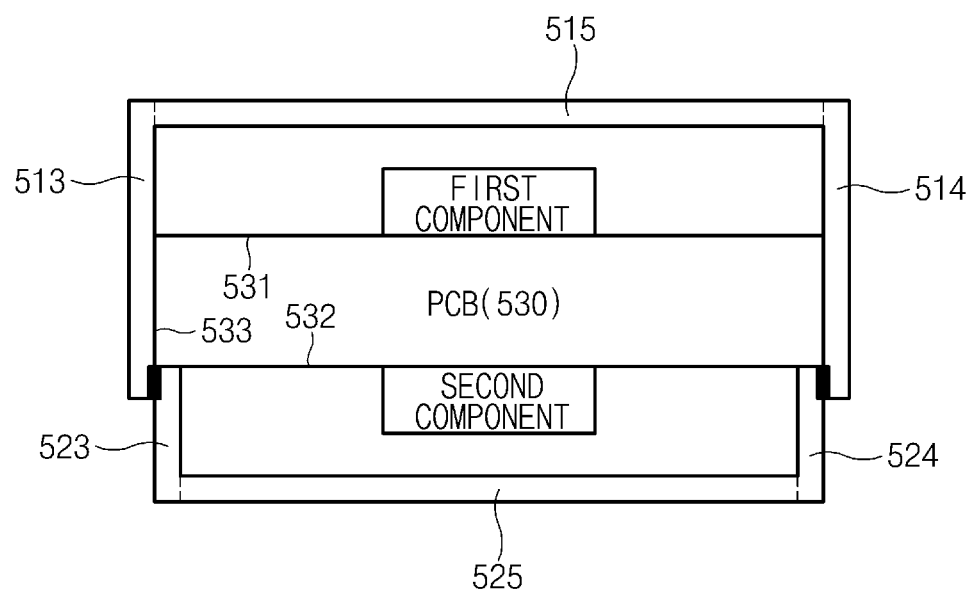
FIG. 8D is a diagram illustrating a first shield can and a second shield can combined together, according to another embodiment.

FIG. 8A is a diagram illustrating a first shield can and a second shield can combined together, according to an embodiment. FIG. 8B is a diagram illustrating a first shield can and a second shield can combined together, according to another embodiment. FIG. 8C is a diagram illustrating a first shield can and a second shield can combined together, according to another embodiment. FIG. 8D is a diagram illustrating a first shield can and a second shield can combined together, according to another embodiment.

Referring to FIG. 8A, the first shield can 510 and the second shield can 520 may be welded together in an area corresponding to the side surface 533. For example, the third side member 513 and the fourth side member 514 of the first shield can 510 may extend from the planar member 515 to the area corresponding to the side surface 533. The third side member 523 and the fourth side member 524 of the second shield can 520 may also extend from the planar member 525 to the area corresponding to the side surface 533. In this case, the third side member 513 of the first shield can 510 and the third side member 523 of the second shield can 520 may be welded together, and the fourth side member 514 of the first shield can 510 and the fourth side member 524 of the second shield can 520 may be welded together.

According to an embodiment, the area where the first shield can 510 and the second shield can 520 are welded together may make contact with the side surface 533 of the PCB 530. In this case, the width of a PBA 810 may be reduced since the welded area makes contact with the side surface 533 of the PCB 530.

According to an embodiment, the welded area may be spaced apart from the side surface 533 of the PCB 530 by a predetermined distance. In this case, a space for absorbing electromagnetic waves generated from components may increase, and thus electromagnetic interference shielding effectiveness of the PBA 810 may be enhanced.

Referring to FIG. 8B, a first section 513-1 of the third side member 513 (and the fourth side member 514) may extend from the planar member 515 to the first surface 531. A second section 513-2 of the third side member 513 may extend from the first section 513-1 to the side surface 533. A third section 513-3 of the third side member 513 may extend from the second section 513-2 to a point between the first surface 531 and the second surface 532. In this case, the third side member 523 may be welded to an opposite side of the third section 513-3 that is opposite to one side making contact with the side surface 533. Since the third section 513-3 and the third side member 523 are welded together, the first shield can 510 and the second shield can 520 may surround the PCB 530. Accordingly, a PBA 820 illustrated in FIG. 8B may have substantially the same electromagnetic interference shielding effectiveness as the PBA 500 illustrated in FIG. 5A.

Referring to FIG. 8C, the first section 513-1 of the third side member 513 may extend from the planar member 515 to the first surface 531. The second section 513-2 of the third side member 513 may extend from the first section 513-1 to the side surface 533. In this case, the third side member 523 may be welded to one end of the second section 513-2. Since the one end of the second section 513-2 and the third side member 523 are welded together, the first shield can 510 and the second shield can 520 may surround the PCB 530. Accordingly, a PBA 830 illustrated in FIG. 8C may have substantially the same electromagnetic interference shielding effectiveness as the PBA 500 illustrated in FIG. 5A. Furthermore, since only the third side member 523 is located to correspond to the side surface 533, the PBA 830 illustrated in FIG. 8C may have substantially the same width as the PBA 500 illustrated in FIG. 5A.

Referring to FIG. 8D, the third side member 513 of the first shield can 510 may extend downward beyond the second surface 532 from the planar member 515. In this case, the third side member 523 may be welded onto the third side member 513 and the second surface 532. Since the third side member 513 and the third side member 523 are welded together, the first shield can 510 and the second shield can 520 may surround the PCB 530. Accordingly, a PBA 840 illustrated in FIG. 8D may have substantially the same electromagnetic interference shielding effectiveness as the PBA 500 illustrated in FIG. 5A. Furthermore, since only the third side member 513 of the first shield can 510 is located to correspond to the side surface 533, the PBA 840 illustrated in FIG. 8D may have substantially the same width as the PBA 500 illustrated in FIG. 5A.

Figure 9A:
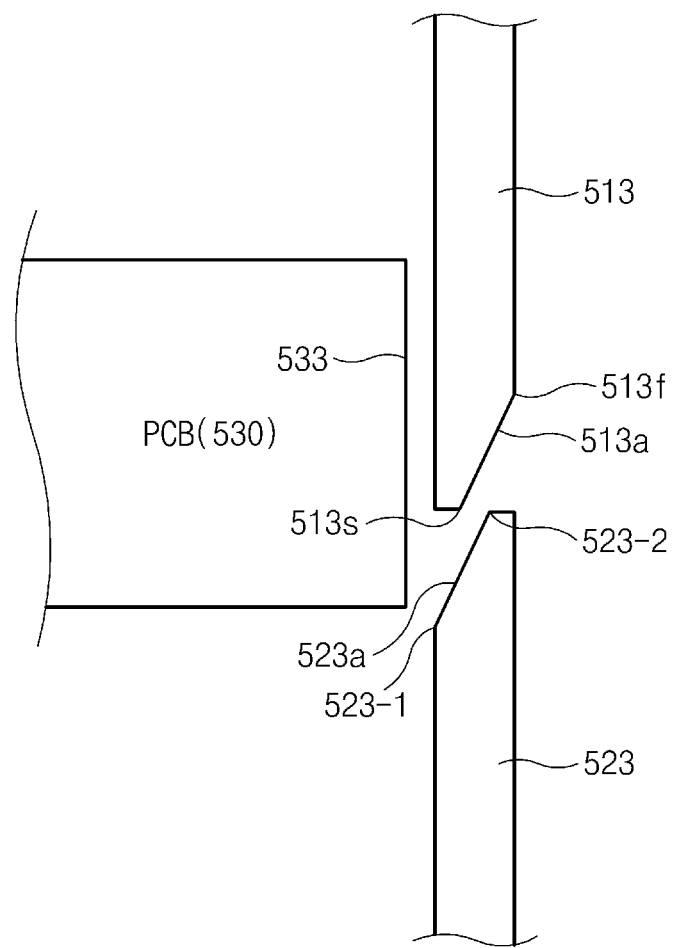
FIG. 9A is a diagram illustrating an enlarged view of combined portions of shield cans according to an embodiment.
Figure 9B:
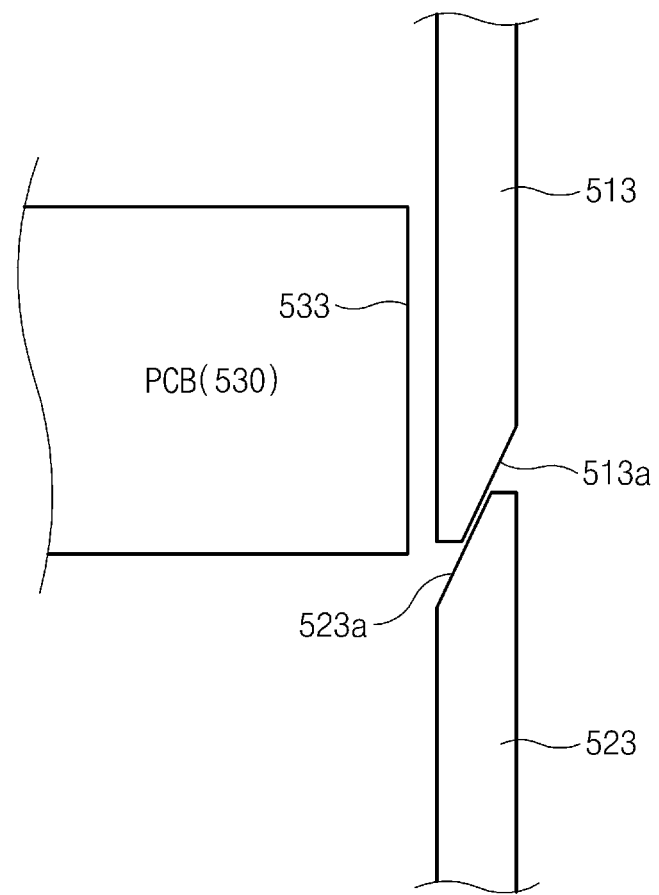
FIG. 9B is a diagram illustrating an enlarged view of combined portions of shield cans according to another embodiment.
Figure 9C:
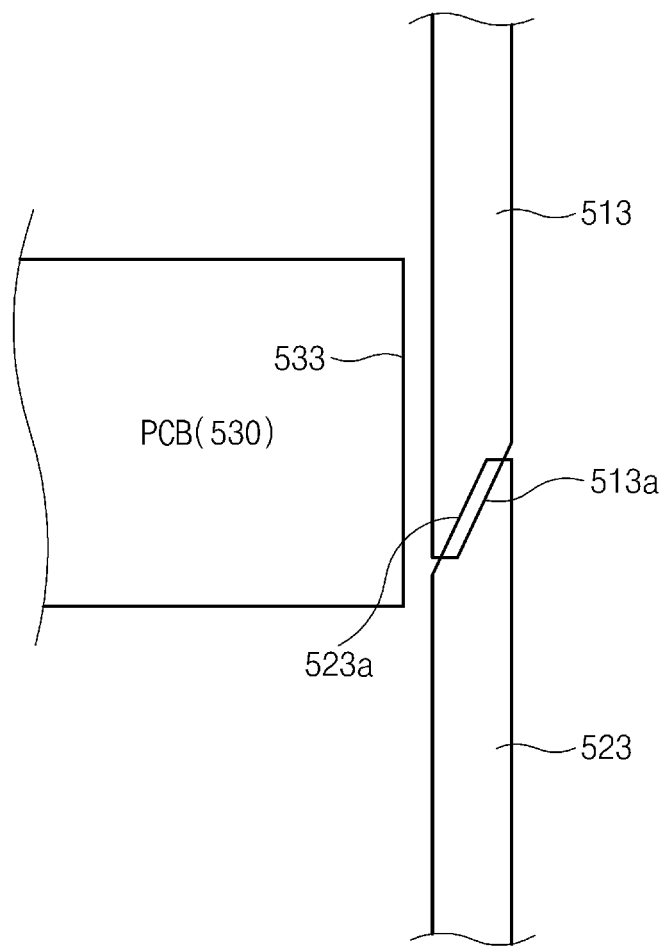
FIG. 9C is a diagram illustrating an enlarged view of combined portions of shield cans according to another embodiment.

FIG. 9A is a diagram illustrating an enlarged view of combined portions of shield cans according to an embodiment. FIG. 9B is a diagram illustrating an enlarged view of combined portions of shield cans according to another embodiment. FIG. 9C is a diagram illustrating an enlarged view of combined portions of shield cans according to another embodiment.

Referring to FIGS. 9A, 9B and 9C, one end 513a of the third side member 513 may have a first slope with respect to the side surface 533. For example, the separation distance between the side surface 533 and the one end 513a may gradually decrease from a first point 513f to a second point 513s. One end 523a of the third side member 523 may have a second slope with respect to the side surface 533. For example, the separation distance between the side surface 533 and the one end 523a may gradually increase from a first point 523-1 to a second point 523-2. Since the ends 513a and 523a of the third side members 513 and 523 have the first and second slopes, respectively, the third side member 513 and the third side member 523 may be easily combined together. Furthermore, since it is easy to combine the third side members 513 and 523, a user may easily weld the third side member 513 and the third side member 523.

Referring to FIG. 9A, the one end 513a of the third side member 513 and the one end 523a of the third side member 523 may be spaced apart from each other by a distance (e.g., 0.057 mm). In this case, if heat is applied to the third side member 513 (or the third side member 523), the third side member 513 and the third side member 523 may be welded together while the liquefied third side member 513 is filling the space between the third side members 513 and 523.

As illustrated in FIG. 9B, the one end 513a of the third side member 513 may make contact with the one end 523a of the third side member 523. If heat is applied in the state in which the one end 513a of the third side member 513 and the one end 523a of the third side member 523 make contact with each other, the third side member 513 and the third side member 523 may be welded together.

As illustrated in FIG. 9C, the one end 513a of the third side member 513 may overlap the one end 523a of the third side member 523. In this case, the third side member 513 may have an inner space formed on the one end 513a thereof such that the one end 513a of the third side member 513 and the one end 523a of the third side member 523 overlap each other. If heat is applied in the state in which the one end 513a of the third side member 513 and the one end 523a of the third side member 523 overlap each other, the third side member 513 and the third side member 523 may be welded together.

Figure 10A:
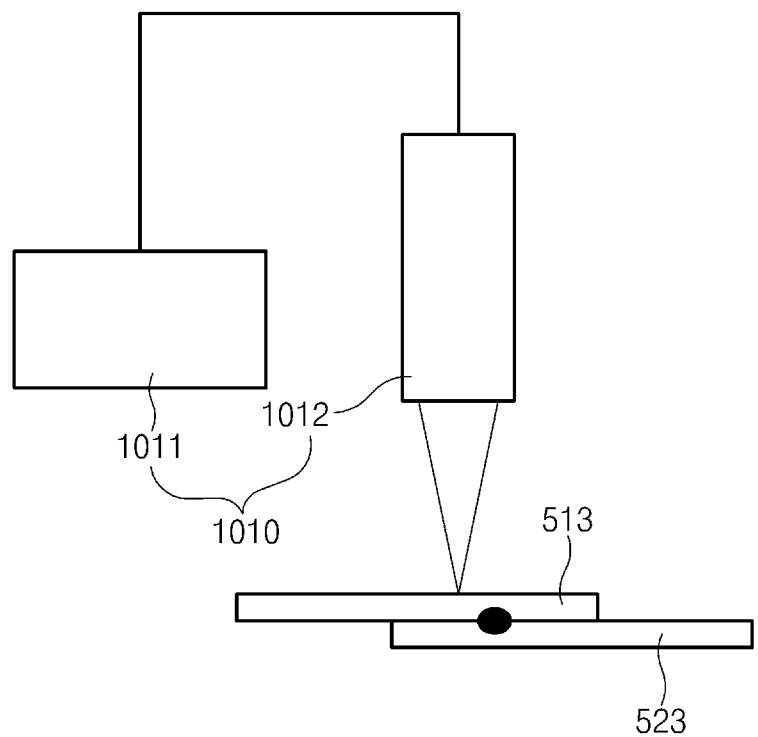
FIG. 10A is a diagram illustrating an example process of welding shield cans according to an embodiment.
Figure 10C:
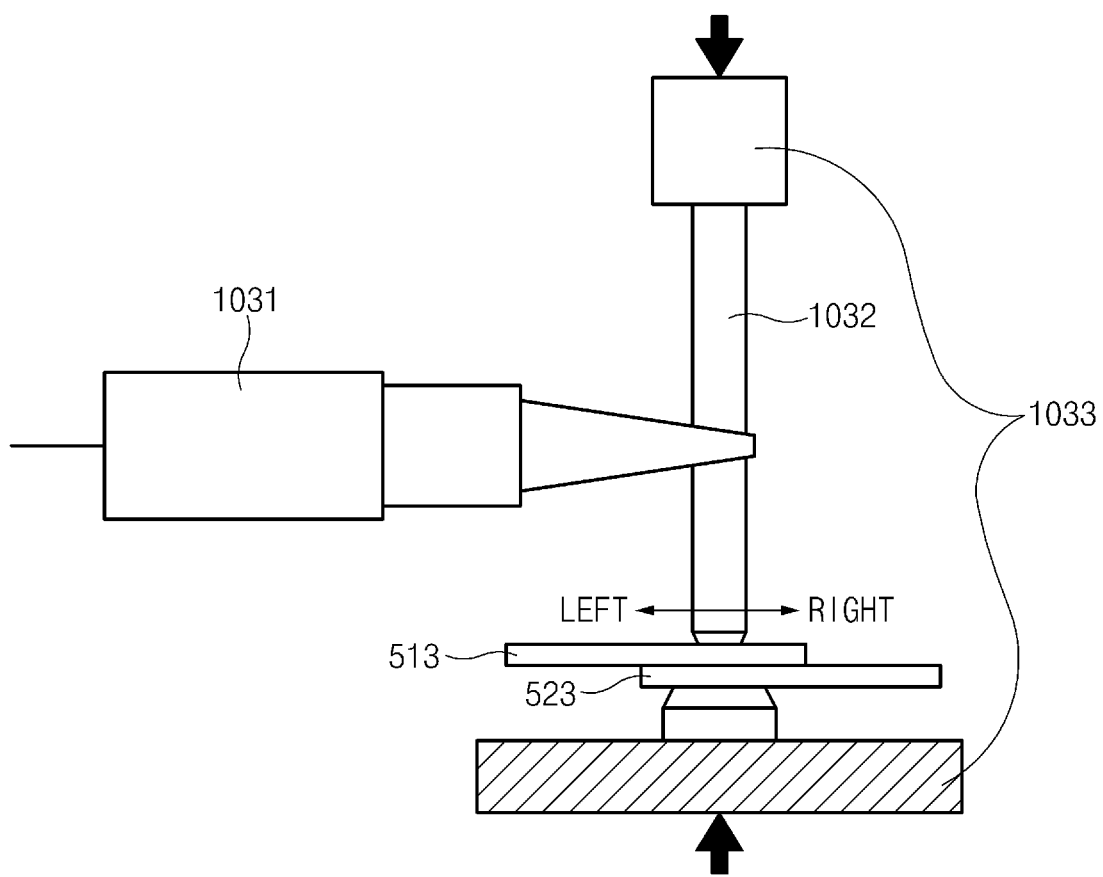
FIG. 10C is a diagram illustrating an example process of welding shield cans according to another embodiment.

FIG. 10A is a diagram illustrating an example process of welding shield cans according to an embodiment. FIG. 10B is a diagram illustrating an example process of welding shield cans according to another embodiment. FIG. 10C is a diagram illustrating an example process of welding shield cans according to another embodiment. FIGS. 10A, 10B, and 10C illustrate processes of welding the third side member 513 (or the fourth side member 514) and the third side member 523 (or the fourth side member 524) illustrated in FIG. 5A.

Referring to FIG. 10A, a laser welding machine 1010 may include a laser generation part 1011 and a head part 1012. The laser generation part 1011 may transmit a generated laser to the head part 1012. The head part 1012 may apply the laser to a portion to be welded. For example, the head part 1012 may apply the laser to welding surfaces or welding points of the third side members 513 and 523 to weld the third side member 513 and the third side member 523. When the laser is applied, the surfaces or points may be welded together.

Referring to FIG. 10B, a resistance welding machine 1020 may include a first electrode 1021 and a second electrode 1022. The first electrode 1021 may be electrically connected with the third side member 513, and the second electrode 1022 may be electrically connected with the third side member 523. The resistance welding machine 1020 may allow current to flow from the first electrode 1021 to the second electrode 1022 (or from the second electrode 1022 to the first electrode 1021), and the third side member 513 and the third side member 523 may be welded together by heat generated when the current flows.

Referring to FIG. 10C, an ultrasonic welding machine 1030 may include a vibration generation part 1031, a vibration transmission part 1032, and a pressurizer 1033. The vibration generation part 1031 may vibrate on the basis of ultrasonic waves. The vibration transmission part 1032 may be connected with the vibration generation part 1031 and the third side member 513, and therefore the third side member 513 may vibrate on a surface of the third side member 523. When the third side member 513 vibrates, heat may be generated, and the pressurizer 1033 may apply a predetermined pressure to the third side member 513 and the third side member 523. Since the pressure is applied to the third side member 513 and the third side member 523 in the state in which heat is generated, the third side member 513 and the third side member 523 may be welded together.

Figure 11A:
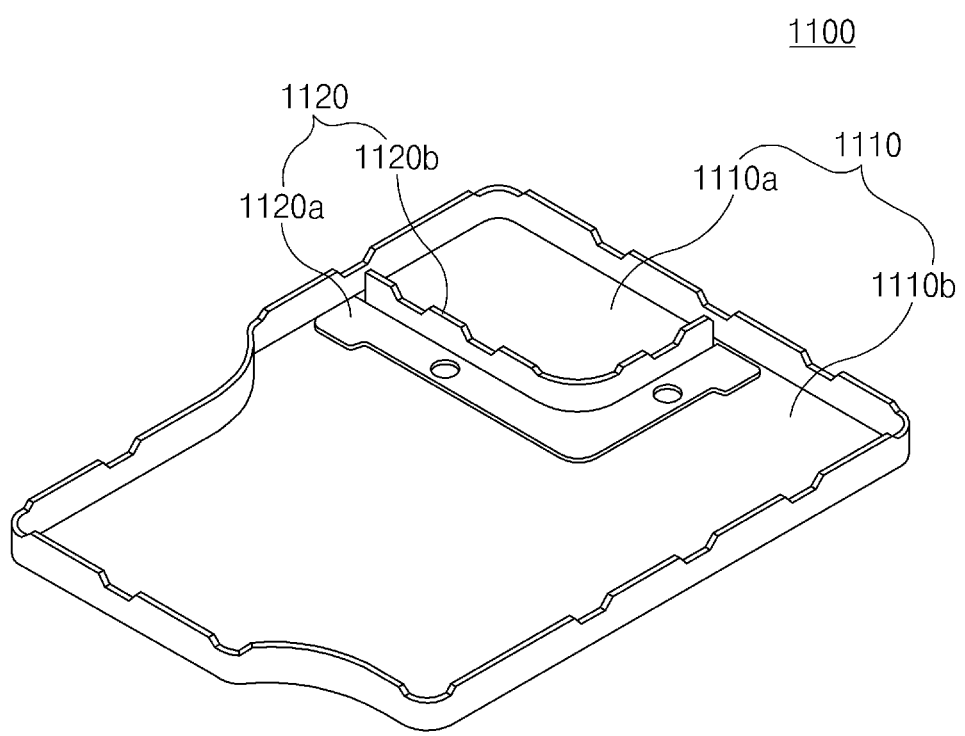
FIG. 11A is a plan view illustrating a shield can according to an embodiment.
Figure 11B:
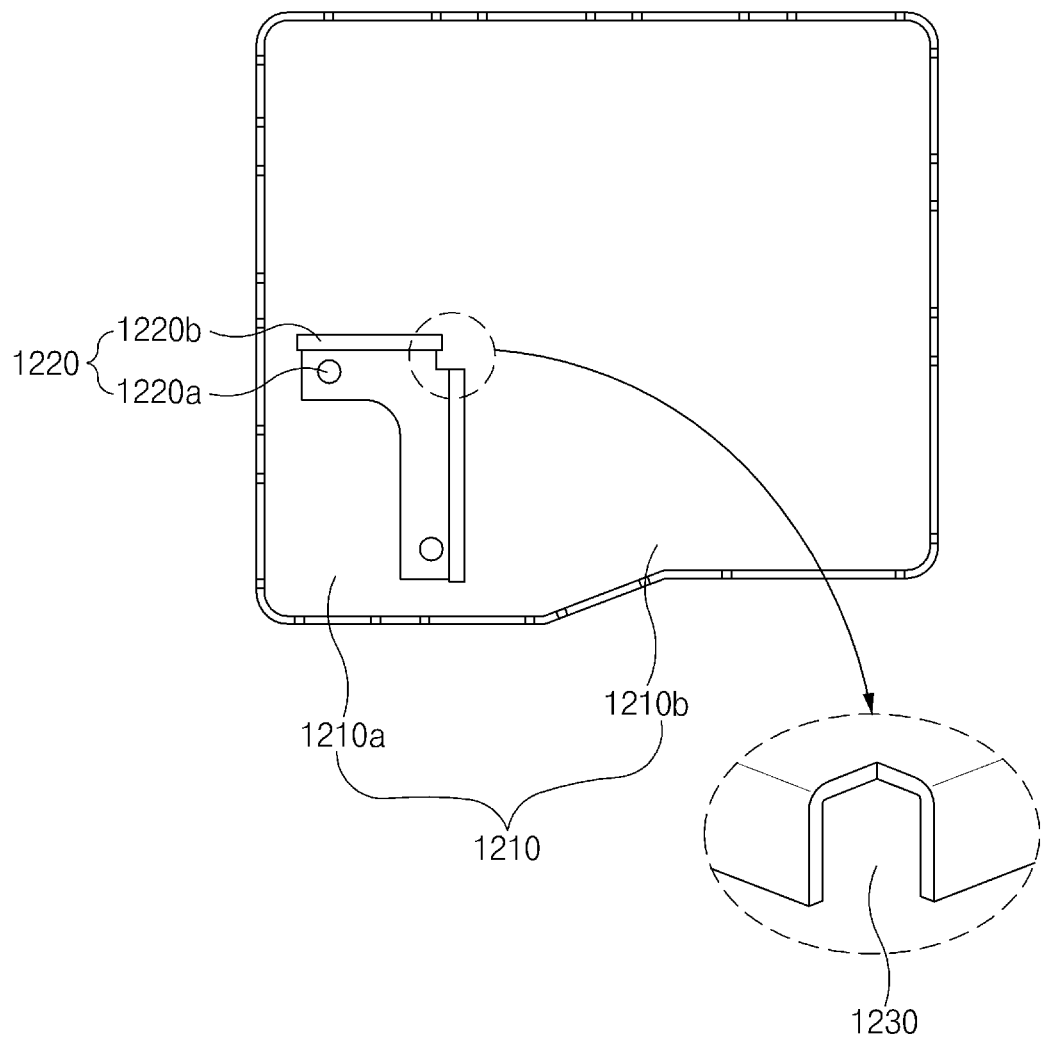
FIG. 11B is a plan view illustrating a shield can according to another embodiment.

FIG. 11A is a plan view illustrating an example shield can according to an embodiment. FIG. 11B is a plan view illustrating an example shield can according to another embodiment.

Referring to FIG. 11A, a shield can 1100 may include a shielding wall 1120. The shielding wall 1120 may separate a planar member 1110 into a first section 1110*a* and a second section 1110*b*. Since the planar member 1110 is separated into the first section 1110*a* and the second section 1110*b*, components disposed in the first section 1110*a* and the second section 1110*b* may be separated from one another. Electromagnetic interference between the separated components may be blocked. According to an embodiment of the present disclosure, by separating the components using the shielding wall 1120, it is possible to shield electromagnetic waves generated from the plurality of components, by using the single shield can 1100.

Referring to FIGS. 11A and 11B, shielding walls 1120 and 1220 may be welded onto surfaces of planar members 1110 and 1210. As with FIG. 11A, the shielding wall 1220 of FIG. 11B may separate a planar member 1210 into a first section 1210*a* and a second section 1210*b*. Since the planar member 1210 is separated into the first section 1210*a* and the second section 1210*b*, components disposed in the first section 1210*a* and the second section 1210*b* may be separated from one another. For example, as illustrated in FIG. 11A, a welding part 1120*a* may be directed toward the center of the shield can 1100 and may be welded to the planar member 1110. In this case, a side surface 1120*b* connected with the welding part 1120*a* may separate the components. Referring to FIG. 11B, a welding part 1220*a* may be directed toward a side member of a shield can 1200, unlike in the above-described embodiment. In this case, the shield can 1200 may have a space 1230 formed between side surfaces 1220*b* thereof, unlike the shield can 1100 illustrated in FIG. 11A.

An electronic device according to an embodiment of the present disclosure may include a printed circuit board (PCB) including a first surface, a second surface facing away from the first surface, and a side surface surrounding a space between the first surface and the second surface, at least one component disposed on the first surface, a shield can that surrounds the at least one component and a partial area of the PCB, and an adhesive member that bonds the shield can and the first surface, and the shield can and the second surface, wherein at least a portion of the shield can may not bond with the side surface.

According to an embodiment of the present disclosure, the electronic device may further include at least one component disposed on the second surface.

According to an embodiment of the present disclosure, the shield can may include a first shield can bonding with the first surface and a second shield can bonding with the second surface, and the first shield can and the second shield can may be physically combined together in an area corresponding to the side surface.

According to an embodiment of the present disclosure, the first shield can and the second shield can may be combined in the area corresponding to the side surface by welding.

According to an embodiment of the present disclosure, the remaining portion of the shield can may make contact with the side surface.

According to an embodiment of the present disclosure, the at least a portion of the shield can is separated from the side surface by specified separation distance.

An electronic device according to an embodiment of the present disclosure may include a printed circuit board (PCB) including a first surface, a second surface facing away from the first surface, and a side surface surrounding a space between the first surface and the second surface, a component disposed on the first surface, a first shield can including a planar member parallel to the first surface and a side member surrounding the component, and a second shield can disposed on the opposite side to the first shield can with respect to the PCB, wherein an area of the side member that is connected with the second shield can may be spaced apart from the side surface.

According to an embodiment of the present disclosure, a first area of the side member that is connected with the second shield can may be welded to the second shield can, and a second area of the side member that is connected with the PCB may be soldered on the PCB.

According to an embodiment of the present disclosure, the first area may be located in an area corresponding to the side surface.

According to an embodiment of the present disclosure, the first area includes a slope inclined at a specified angle with respect to a plane parallel to the side surface.

According to an embodiment of the present disclosure, the PCB may further include a ground layer disposed between the first surface and the second surface and a pad extending from the ground layer to the first surface, and the second area may be soldered on the pad.

According to an embodiment of the present disclosure, at least a portion of the side member and at least a portion of the second shield can may be connected together through a conductive tape or a conductive adhesive.

According to an embodiment of the present disclosure, at least a portion of the side member and at least a portion of the second shield can may be soldered.

According to an embodiment of the present disclosure, the component may correspond to a first component, the electronic device may further include a second component disposed on the second surface, and the second shield can may cover the second component.

According to an embodiment of the present disclosure, the component may correspond to any one of a central processing unit (CPU), an application processor (AP), a communication processor (CP), and a memory.

An electronic device according to an embodiment of the present disclosure may include a PCB including a first surface, a second surface facing away from the first surface, and a side surface surrounding a space between the first surface and the second surface, a component disposed on the first surface, a first shield can that has at least a portion disposed on the first surface and covers the component, and a second shield can having at least a portion disposed on the second surface. The first surface and the first shield can, and the second surface and the second shield can may be connected through an adhesive member, and the first shield can and the second shield can may be physically connected.

According to an embodiment of the present disclosure, the first shield can may be soldered on the first surface, and the first shield can and the second shield can may be welded.

According to an embodiment of the present disclosure, the first shield can and the second shield can may include a first planar surface and a second planar surface parallel to the side surface, respectively, and the first planar surface and the second planar surface may be welded.

According to an embodiment of the present disclosure, a distance between the first planar and the side surface is different from a distance between the second planar and the side surface.

According to an embodiment of the present disclosure, the electronic device may further include a component disposed between the second surface and the second shield can.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a printed circuit board (PCB) including a first surface, a second surface facing a direction opposite the first surface, and a side surface between the first surface and the second surface;
   at least one component disposed on the first surface;
   a shield can including: a first shield can configured to surround the at least one component and the first surface,
   a second shield can configured to surround the second surface,
   a welded area including a first welded area in which a first side member of the first shield can and a first side member of the second shield can are welded together, and a second welded area in which a second side member of the first shield can and a second side member of the second shield can are welded together, and
   a soldered area including a first soldered area in which a third side member of the first shield can and a third side member of the second shield can are connected to a ground layer located between the first surface and the second surface, and a second soldered area in which a fourth side member of the first shield can and a fourth side member of the second shield can are connected to the ground layer,
   wherein the first side member of the first shield can is parallel to the second side member of the first shield can, the third side member of the first shield can is parallel to the fourth side member of the first shield can, the first side member of the second shield can is parallel to the second side member of the second shield can, and the third side member of the second shield can is parallel to the fourth side member of the second shield can; and
   wherein an inner surface of the welded area of the shield can is located at a predetermined distance from the side surface of the PCB so that a gap of the predetermined distance is formed between the inner surface of the welded area and the side surface of the PCB, and the PCB includes a first portion which is extended outside of the shield can through between the third side member of the first shield can and a third side member of the second shield can.

2. The electronic device of claim 1, further comprising:
   at least one component disposed on the second surface.

3. The electronic device of claim 1, wherein the first shield can and the second shield can are physically connected in the area corresponding to the side surface.

4. The electronic device of claim 1, wherein at least a portion of the shield can contacts the side surface.

5. The electronic device of claim 1, wherein the area of the shield can is spaced apart from the side surface by a specified separation distance.

6. The electronic device of claim 1, furtherer comprising a connecting member soldered to the PCB and disposed between and coupled to the side member of the first shield and the side member of the second shield on the at least one side of shield on which the PCB extends outside of the shield.

7. The electronic device of claim 1, furtherer comprising a connecting member soldered to the PCB and disposed between and coupled to the side member of the first shield and the side member of the second shield on the at least one side of shield on which the PCB extends outside of the shield, and wherein the PCB includes the ground layer disposed between the first surface and the second surface and the side member extends to an interior of the PCB and is coupled to the ground layer.

8. The electronic device of claim 3, wherein the first shield can and the second shield can are welded in the area corresponding to the side surface.

9. An electronic device comprising:
   a printed circuit board (PCB) including a first surface, a second surface facing a direction opposite the first surface, and a side surface between the first surface and the second surface;
   a component disposed on the first surface;
   a first shield can including a planar member parallel to the first surface and a first side member, a second side member, a third side member, a fourth side member of the first shield can at least partially surrounding the component; and
   a second shield can disposed on an opposite side of the PCB with respect to the first shield can and including a first side member, a second side member, a third side member, a fourth side member of the second shield can, a welded area, and a soldered area;

wherein the welded area including a first welded area in which the first side member of the first shield can and the first side member of the second shield can are welded together, and a second welded area in which the second side member of the first shield can and the second side member of the second shield can are welded together, wherein the soldered area including a first soldered area in which the third side member of the first shield can and the third side member of the second shield can are connected to a ground layer located between the first surface and the second surface, and a second soldered area in which the fourth side member of the first shield can and the fourth side member of the second shield can are connected to the ground layer, and wherein the first side member of the first shield can is parallel to the second side member of the first shield can, the third side member of the first shield can is parallel to the fourth side member of the first shield can, the first side member of the second shield can is parallel to the second side member of the second shield can, and the third side member of the second shield can is parallel to the fourth side member of the second shield can;

wherein an inner surface of the welded area is located at a predetermined distance from the side surface of the PCB so that a gap of the predetermined distance is formed between the inner surface of the welded area and the side surface of the PCB, and the PCB includes a first portion which is extended outside of the shield can through between the third side member of the first shield can and a third side member of the second shield can.

10. The electronic device of claim 9, wherein a first area of the side member of the first shield can that is connected with the second shield can is welded to the second shield can, and wherein a second area of the side member of the first shield can that is connected with the PCB is soldered on the PCB.

11. The electronic device of claim 9, wherein at least a portion of the side member of the first shield can and at least a portion of the second shield can are connected together through at least one of a conductive tape and a conductive adhesive.

12. The electronic device of claim 9, wherein at least a portion of the side member of the first shield can and at least a portion of the second shield can are soldered.

13. The electronic device of claim 9, wherein the component corresponds to a first component, wherein the electronic device further comprises a second component disposed on the second surface, and wherein the second shield can covers the second component.

14. The electronic device of claim 9, wherein the component corresponds to any one of: a central processing unit (CPU), an application processor (AP), a communication processor (CP), and a memory.

15. The electronic device of claim 10, wherein the first area is located in an area corresponding to the side surface.

16. The electronic device of claim 10, wherein the first area includes a slope inclined at a specified angle with respect to a plane parallel to the side surface.

17. The electronic device of claim 10, wherein the PCB includes the ground layer disposed between the first surface and the second surface and a pad extending from the ground layer to the first surface, and wherein the second area is soldered on the pad.

18. An electronic device comprising:

a PCB including a first surface, a second surface facing a direction opposite the first surface, and a side surface between the first surface and the second surface;

a component disposed on the first surface;

a first shield can comprising at least a portion disposed on the first surface and configured to cover the component, and a first planar surface, a second planar surface, a third planar surface, a fourth planar surface of the first shield can which are parallel to the side surface;

a second shield can comprising at least a portion disposed on the second surface, and a first planar surface, a second planar surface, a third planar surface, a fourth planar surface of the second shield can which are parallel to the side surface; and a welded area including a first welded area in which the first planar surface of the first shield can and the first planar surface of the second shield can are welded together, and a second welded area in which the second planar surface of the first shield can and the second planar surface of the second shield can are welded together, a soldered area including a first soldered area in which the third planar surface of the first shield can and the third planar surface of the second shield can are connected to a ground layer located between the first surface and the second surface, and a second soldered area in which the fourth planar surface of the first shield can and the fourth planar surface of the second shield can are connected to the ground layer, and wherein the first planar surface of the first shield can is parallel to the second planar surface of the first shield can, the third planar surface of the first shield can is parallel to the fourth planar surface of the first shield can, the first planar surface of the second shield can is parallel to the second planar surface of the second shield can, and the third planar surface of the second shield can is parallel to the fourth planar surface of the second shield can, and wherein an inner surface of the welded area is located at a predetermined distance from the side surface of the PCB so that a gap of the predetermined distance is formed between the inner surface of the welded area and the side surface of the PCB, and the PCB includes a first portion which is extended outside of the shield can through between the third side member of the first shield can and a third side member of the second shield can.

19. The electronic device of claim 18, wherein a distance between the first planar surface and the side surface is different from a distance between the second planar surface and the side surface.

20. The electronic device of claim 18, further comprising:

an another component disposed between the second surface and the second shield can.

* * * * *